(12) United States Patent
Hersam et al.

(10) Patent No.: US 12,116,279 B2
(45) Date of Patent: Oct. 15, 2024

(54) SELF-ASSEMBLED BOROPHENE/GRAPHENE NANORIBBON MIXED-DIMENSIONAL HETEROSTRUCTURES AND METHOD OF SYNTHESIZING SAME

(71) Applicant: NORTHWESTERN UNIVERSITY, Evanston, IL (US)

(72) Inventors: Mark C. Hersam, Wilmette, IL (US); Qiucheng Li, Evanston, IL (US); Xiaolong Liu, Ithaca, NY (US); Eden B Aklile, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 81 days.

(21) Appl. No.: 17/723,595

(22) Filed: Apr. 19, 2022

(65) Prior Publication Data
US 2023/0008590 A1  Jan. 12, 2023

Related U.S. Application Data

(60) Provisional application No. 63/178,579, filed on Apr. 23, 2021.

(51) Int. Cl.
*C01B 32/182* (2017.01)
*B82Y 30/00* (2011.01)
(Continued)

(52) U.S. Cl.
CPC ......... *C01B 32/182* (2017.08); *C01B 35/023* (2013.01); *H01L 21/02425* (2013.01);
(Continued)

(58) Field of Classification Search
None
See application file for complete search history.

(56) References Cited

U.S. PATENT DOCUMENTS

| 2018/0222755 A1 | 8/2018 | Hersam et al. |
| 2019/0079041 A1* | 3/2019 | Sinitskii ............... G01N 27/127 |

(Continued)

OTHER PUBLICATIONS

Mannix, A. J.; Zhou, X.-F.; Kiraly, B.; Wood, J. D.; Alducin, D.; Myers, B. D.; Liu, X.; Fisher, B. L.; Santiago, U.; Guest, J. R.; Yacaman, M. J.; Ponce, A.; Oganov, A. R.; Hersam, M. C.; Guisinger, N. P. Synthesis of Borophenes: Anisotropic, Two-Dimensional Boron Polymorphs. Science 2015, 350, 1513-1516.
(Continued)

*Primary Examiner* — Katie L. Hammer
(74) *Attorney, Agent, or Firm* — Locke Lord LLP; Tim Tingkang Xia, Esq.

(57) ABSTRACT

This invention in one aspect relates to a method of synthesizing a self-assembled mixed-dimensional heterostructure including 2D metallic borophene and 1D semiconducting armchair-oriented graphene nanoribbons (aGNRs). The method includes depositing boron on a substrate to grow borophene thereon at a substrate temperature in an ultrahigh vacuum (UHV) chamber; sequentially depositing 4,4"-dibromo-p-terphenyl on the borophene grown substrate at room temperature in the UHV chamber to form a composite structure; and controlling multi-step on-surface coupling reactions of the composite structure to self-assemble a borophene/graphene nanoribbon mixed-dimensional heterostructure. The borophene/aGNR lateral heterointerfaces are structurally and electronically abrupt, thus demonstrating atomically well-defined metal-semiconductor heterojunctions.

7 Claims, 12 Drawing Sheets

(51) Int. Cl.
      *B82Y 40/00*       (2011.01)
      *C01B 32/184*      (2017.01)
      *C01B 35/02*       (2006.01)
      *H01L 21/02*       (2006.01)
      *H01L 21/285*      (2006.01)

(52) U.S. Cl.
      CPC .. *H01L 21/02491* (2013.01); *H01L 21/02499* (2013.01); *H01L 21/02516* (2013.01); *H01L 21/02527* (2013.01); *H01L 21/02603* (2013.01); *H01L 21/02617* (2013.01); *H01L 21/28506* (2013.01); *B82Y 30/00* (2013.01); *B82Y 40/00* (2013.01); *C01B 32/184* (2017.08); *C01B 2204/06* (2013.01); *C01B 2204/20* (2013.01)

(56) References Cited

U.S. PATENT DOCUMENTS

2019/0292061 A1* 9/2019 Chopra ............... C30B 25/02
2020/0259066 A1* 8/2020 Braeuninger-Weimer ...................
                                                    H10N 60/853

OTHER PUBLICATIONS

Mannix, A. J.; Zhang, Z.; Guisinger, N. P.; Yakobson, B. I.; Hersam, M. C. Borophene as a Prototype for Synthetic 2D Materials Development. Nat. Nanotechnol. 2018, 13, 444-450.

Liu, X.; Zhang, Z.; Wang, L.; Yakobson, B. I.; Hersam, M. C. Intermixing and Periodic Self-Assembly of Borophene Line Defects. Nat. Mater. 2018, 17, 783-788.

Penev, E. S.; Kutana, A.; Yakobson, B. I. Can Two-Dimensional Boron Superconduct? Nano Lett. 2016, 16, 2522-2526.

Penev, E. S.; Bhowmick, S.; Sadrzadeh, A.; Yakobson, B. I. Polymorphism of Two-Dimensional Boron. Nano Lett. 2012, 12, 2441-2445.

Feng, B.; Zhang, J.; Zhong, Q.; Li, W.; Li, S.; Li, H.; Cheng, P.; Meng, S.; Chen, L.; Wu, K. Experimental Realization of Two-Dimensional Boron Sheets. Nat. Chem. 2016, 8, 563-568.

Liu, X.; Wang, L.; Li, S.; Rahn, M. S.; Yakobson, B. I.; Hersam, M. C. Geometric Imaging of Borophene Polymorphs with Functionalized Probes. Nat. Commun. 2019, 10, 1642.

Novoselov, K. S.; Geim, A. K .; Morozov, S. V.; Jiang, D.; Katsnelson, M. I.; Grigorieva, I. V.; Dubonos, S. V.; Firsov, A. A. Two-Dimensional Gas of Massless Dirac Fermions in Graphene. Nature 2005, 438, 197-200.

Feng, Y.; Liu, D.; Feng, B.; Liu, X.; Zhao, L.; Xie, Z.; Liu, Y.; Liang, A.; Hu, C.; Hu, Y.; He, S.; Liu, G.; Zhang, J.; Chen, C.; Xu, Z.; Chen, L.; Wu, K.; Liu, Y.-T.; Lin, H.; Huang, Z.-Q.; Hsu, C.-H.; Chuang, F.-C.; Bansil, A.; Zhou, X. J. Direct Evidence of Interaction-Induced Dirac Cones in a Monolayer Silicene/Ag(111) System. Proc. Natl. Acad. Sci. U. S. A. 2016, 113, 14656-14661.

Liu, H.; Neal, A. T.; Zhu, Z.; Luo, Z.; Xu, X.; Tománek, D.; Ye, P. D. Phosphorene: An Unexplored 2D Semiconductor with a High Hole Mobility. ACS Nano 2014, 8, 4033-4041.

Cai, J.; Ruffieux, P.; Jaafar, R.; Bieri, M.; Braun, T.; Blankenburg, S.; Muoth, M.; Seitsonen, A. P.; Saleh, M.; Feng, X.; Müllen, K.; Fasel, R. Atomically Precise Bottom-Up Fabrication of Graphene Nanoribbons. Nature 2010, 466, 470-473.

Chen, Y.-C.; de Oteyza, D. G.; Pedramrazi, Z.; Chen, C.; Fischer, F. R.; Crommie, M. F. Tuning the Band Gap of Graphene Nanoribbons Synthesized from Molecular Precursors. ACS Nano 2013, 7, 6123-6128.

Basagni, A.; Sedona, F.; Pignedoli, C. A.; Cattelan, M.; Nicolas, L.; Casarin, M.; Sambi, M. Molecules-Oligomers-Nanowires-Graphene Nanoribbons: A Bottom-Up Stepwise On-Surface Covalent Synthesis Preserving Long-Range Order. J. Am. Chem. Soc. 2015, 137, 1802-1808.

Kimouche, A.; Ervasti, M. M.; Drost, R.; Halonen, S.; Harju, A.; Joensuu, P. M.; Sainio, J.; Liljeroth, P. Ultra-Narrow Metallic Armchair Graphene Nanoribbons. Nat. Commun. 2015, 6, 10177.

Zhang, H.; Lin, H.; Sun, K.; Chen, L.; Zagranyarski, Y.; Aghdassi, N.; Duhm, S.; Li, Q.; Zhong, D.; Li, Y.; Müllen, K.; Fuchs, H.; Chi, L. On-Surface Synthesis of Rylene-Type Graphene Nanoribbons. J. Am. Chem. Soc. 2015, 137, 4022-4025.

Talirz, L.; Söde, H.; Dumslaff, T.; Wang, S.; Sanchez-Valencia, J. R.; Liu, J.; Shinde, P.; Pignedoli, C. A.; Liang, L.; Meunier, V.; Plumb, N. C.; Shi, M.; Feng, X.; Narita, A.; Müllen, K.; Fasel, R.; Ruffieux, P. On-Surface Synthesis and Characterization of 9-Atom Wide Armchair Graphene Nanoribbons. ACS Nano 2017, 11, 1380-1388.

Merino-Díez, N.; Garcia-Lekue, A.; Carbonell-Sanromà, E.; Li, J.; Corso, M.; Colazzo, L.; Sedona, F.; Sánchez-Portal, D.; Pascual, J. I.; de Oteyza, D. G. Width-Dependent Band Gap in Armchair Graphene Nanoribbons Reveals Fermi Level Pinning on Au(111). ACS Nano 2017, 11, 11661-11668.

Han, P.; Akagi, K.; Federici Canova, F.; Mutoh, H.; Shiraki, S.; Iwaya, K.; Weiss, P. S.; Asao, N.; Hitosugi, T. Bottom-Up Graphene-Nanoribbon Fabrication Reveals Chiral Edges and Enantioselectivity. ACS Nano 2014, 8, 9181-9187.

Liu, J.; Li, B.-W.; Tan, Y.-Z .; Giannakopoulos, A.; Sanchez-Sanchez, C.; Beljonne, D.; Ruffieux, P.; Fasel, R.; Feng, X.; Müllen, K. Toward Cove-Edged Low Band Gap Graphene Nanoribbons. J. Am. Chem. Soc. 2015, 137, 6097-6103.

Ruffieux, P.; Wang, S.; Yang, B.; Sánchez-Sánchez, C.; Liu, J.; Dienel, T.; Talirz, L.; Shinde, P.; Pignedoli, C. A.; Passerone, D.; Dumslaff, T.; Feng, X.; Müllen, K.; Fasel, R. On-Surface Synthesis of Graphene Nanoribbons with Zigzag Edge Topology. Nature 2016, 531, 489-492.

De Oteyza, D. G.; García-Lekue, A.; Vilas-Varela, M.; Merino-Díez, N.; Carbonell-Sanromà, E.; Corso, M.; Vasseur, G.; Rogero, C.; Guitián, E.; Pascual, J. I.; Ortega, J. E.; Wakayama, Y.; Peña, D. Substrate-Independent Growth of Atomically Precise Chiral Graphene Nanoribbons. ACS Nano 2016, 10, 9000-9008.

Nguyen, G. D.; Tsai, H.-Z.; Omrani, A. A.; Marangoni, T.; Wu, M.; Rizzo, D. J.; Rodgers, G. F.; Cloke, R. R.; Durr, R. A.; Sakai, Y.; Liou, F.; Aikawa, A. S.; Chelikowsky, J. R.; Louie, S. G.; Fischer, F. R.; Crommie, M. F. Atomically Precise Graphene Nanoribbon Heterojunctions from a Single Molecular Precursor. Nat. Nanotechnol. 2017, 12, 1077-1082.

Rizzo, D. J.; Veber, G.; Cao, T.; Bronner, C.; Chen, T.; Zhao, F.; Rodriguez, H.; Louie, S. G.; Crommie, M. F.; Fischer, F. R. Topological Band Engineering of Graphene Nanoribbons. Nature 2018, 560, 204-208.

Gröning, O.; Wang, S.; Yao, X.; Pignedoli, C. A.; Borin Barin, G.; Daniels, C.; Cupo, A.; Meunier, V.; Feng, X.; Narita, A.; Müllen, K.; Ruffieux, P.; Fasel, R. Engineering of Robust Topological Quantum Phases in Graphene Nanoribbons. Nature 2018, 560, 209-213.

Slota, M.; Keerthi, A.; Myers, W. K.; Tretyakov, E.; Baumgarten, M.; Ardavan, A.; Sadeghi, H.; Lambert, C. J.; Narita, A.; Müllen, K.; Bogani, L. Magnetic Edge States and Coherent Manipulation of Graphene Nanoribbons. Nature 2018, 557, 691-695.

Simonov, K. A.; Generalov, A. V.; Vinogradov, A. S.; Svirskiy, G. I.; Cafolla, A. A.; McGuinness, C.; Taketsugu, T.; Lyalin, A.; Mårtensson, N.; Preobrajenski, A. B. Synthesis of Armchair Graphene Nanoribbons from the 10,10'-Dibromo-9,9'-Bianthracene Molecules on Ag(111): The Role of Organometallic Intermediates. Sci. Rep. 2018, 8, 3506.

Huang, H.; Wei, D.; Sun, J.; Wong, S. L.; Feng, Y. P.; Neto, A. H. C.; Wee, A. T. S. Spatially Resolved Electronic Structures of Atomically Precise Armchair Graphene Nanoribbons. Sci. Rep. 2012, 2, 983.

Jariwala, D.; Marks, T. J.; Hersam, M. C. Mixed-Dimensional van der Waals Heterostructures. Nat. Mater. 2016, 16, 170-181.

Ci, L.; Song, L.; Jin, C.; Jariwala, D.; Wu, D.; Li, Y.; Srivastava, A.; Wang, Z. F.; Storr, K.; Balicas, L.; Liu, F.; Ajayan, P. M. Atomic Layers of Hybridized Boron Nitride and Graphene Domains. Nat. Mater. 2010, 9, 430-435.

Liu, L.; Park, J.; Siegel, D. A.; McCarty, K. F.; Clark, K. W.; Deng, W.; Basile, L.; Idrobo, J. C.; Li, A.-P.; Gu, G. Heteroepitaxial

(56) References Cited

OTHER PUBLICATIONS

Growth of Two-Dimensional Hexagonal Boron Nitride Templated by Graphene Edges. Science 2014, 343, 163-167.

Gao, Y.; Zhang, Y.; Chen, P.; Li, Y.; Liu, M.; Gao, T.; Ma, D.; Chen, Y.; Cheng, Z.; Qiu, X.; Duan, W.; Liu, Z. Toward Single-Layer Uniform Hexagonal Boron Nitride-Graphene Patchworks with Zigzag Linking Edges. Nano Lett. 2013, 13, 3439-3443.

Li, M.-Y.; Shi, Y.; Cheng, C.-C.; Lu, L.-S.; Lin, Y.-C.; Tang, H.-L.; Tsai, M.-L.; Chu, C.-W.; Wei, K.-H.; He, J.-H.; Chang, W.-H.; Suenaga, K.; Li, L.-J. Epitaxial Growth of a Monolayer WSe2—MoS2 Lateral p-n Junction with an Atomically Sharp Interface. Science 2015, 349, 524-528.

Gong, Y.; Lin, J.; Wang, X.; Shi, G.; Lei, S.; Lin, Z.; Zou, X.; Ye, G.; Vajtai, R.; Yakobson, B. I.; Terrones, H.; Terrones, M.; Tay, Beng K.; Lou, J.; Pantelides, S. T.; Liu, Z.; Zhou, W.; Ajayan, P. M. Vertical and In-Plane Heterostructures from WS2/MoS2 Monolayers. Nat. Mater. 2014, 13, 1135-1142.

Liu, X.; Hersam, M. C. Borophene-Graphene Heterostructures. Sci. Adv. 2019, 5, eaax6444.

Ong, C. W.; Huang, H.; Zheng, B.; Kwok, R. W. M.; Hui, Y. Y.; Lau, W. M. X-Ray Photoemission Spectroscopy of Nonmetallic Materials: Electronic Structures of Boron and BxOy. J. Appl. Phys. 2004, 95, 3527-3534.

Park, J.; Kim, K. Y.; Chung, K.-H.; Yoon, J. K.; Kim, H.; Han, S.; Kahng, S.-J. Interchain Interactions Mediated by Br Adsorbates in Arrays of Metal-Organic Hybrid Chains on Ag(111). J. Phys. Chem. C 2011, 115, 14834-14838.

Pham, T. A.; Song, F.; Nguyen, M.-T.; Stöhr, M. Self-Assembly of Pyrene Derivatives on Au(111): Substituent Effects on Intermolecular Interactions. Chem. Comm. 2014, 50, 14089-14092.

Zint, S.; Ebeling, D.; Schlöder, T.; Ahles, S.; Mollenhauer, D.; Wegner, H. A.; Schirmeisen, A. Imaging Successive Intermediate States of the On-Surface Ullmann Reaction on Cu(111): Role of the Metal Coordination. ACS Nano 2017, 11, 4183-4190.

Wang, W.; Shi, X.; Wang, S.; Van Hove, M. A.; Lin, N. Single-Molecule Resolution of an Organometallic Intermediate in a Surface-Supported Ullmann Coupling Reaction. J. Am. Chem. Soc. 2011, 133, 13264-13267.

Liu, X.; Wei, Z.; Balla, I.; Mannix, A. J.; Guisinger, N. P.; Luijten, E.; Hersam, M. C. Self-Assembly of Electronically Abrupt Borophene/Organic Lateral Heterostructures. Sci. Adv. 2017, 3, e1602356.

Yang, Z.; Zhang, Y.; Zhang, J.; Zhang, K.; Che, J.; Sun, Q. The Adsorption of Ag and Sb on Ag(111) Surface. Phys. Status Solidi B 1999, 212, 281-285.

Chung, K.-H.; Koo, B.-G.; Kim, H.; Yoon, J. K.; Kim, J.-H.; Kwon, Y.-K.; Kahng, S.-J. Electronic Structures of One-Dimensional Metal-Molecule Hybrid Chains Studied Using Scanning Tunneling Microscopy and Density Functional Theory. Phys. Chem. Chem. Phys. 2012, 14, 7304-7308.

Sutter, P.; Cortes, R.; Lahiri, J.; Sutter, E. Interface Formation in Monolayer Graphene-Boron Nitride Heterostructures. Nano Lett. 2012, 12, 4869-4874.

Liu, X.; Balla, I.; Bergeron, H.; Campbell, G. P.; Bedzyk, M. J.; Hersam, M. C. Rotationally Commensurate Growth of MoS2 on Epitaxial Graphene. ACS Nano 2016, 10, 1067-1075.

[45]. Li, Q.; Kolluru, V. S. C.; Rahn, M. S.; Schwenker, E.; Li, S.; Hennig, R. G.; Darancet, P.; Chan, M. K. Y.; Hersam, M. C. Synthesis of Borophane Polymorphs through Hydrogenation of Borophene. Science 2021, 371, 1143-1148.

[46]. Feng B.; Zhang J.; Liu R. Y.; Iimori T.; Lian C.; Li H.; Chen L.; Wu K.; Meng S.; Komori F.; Matsuda I. Direct Evidence of Metallic Bands in a Monolayer Boron Sheet. Phys. Rev. B 2016, 94, 041408.

[47] Zhang Z.; Mannix A. J.; Hu Z.; Kiraly B.; Guisinger N. P.; Hersam M. C.; Yakobson B. I. Substrate-Induced Nanoscale Undulations of Borophene on Silver. Nano Lett. 2016, 16, 6622-6627.

Huang C.; Wu S.; Sanchez A. M.; Peters J. J. P.; Beanland R.; Ross J. S.; Rivera P.; Yao W.; Cobden D. H.; Xu X. Lateral Heterojunctions within Monolayer MoSe2—WSe2 Semiconductors Nat. Mater. 2014, 13, 1096-1101.

* cited by examiner

SELF-ASSEMBLED BOROPHENE/GRAPHENE NANORIBBON MIXED-DIMENSIONAL HETEROSTRUCTURES AND METHOD OF SYNTHESIZING SAME

CROSS-REFERENCE TO RELATED PATENT APPLICATION

This application claims priority to and the benefit of U.S. Provisional Application Ser. No. 63/178,579, filed Apr. 23, 2021, which is incorporated herein by reference in its entirety.

STATEMENT AS TO RIGHTS UNDER FEDERALLY-SPONSORED RESEARCH

This invention was made with government support under 1720139 awarded by the National Science Foundation, and N00014-17-1-2993 awarded by the Office of Naval Research. The government has certain rights in the invention.

FIELD OF THE INVENTION

This invention relates generally to the material science, and more particularly to self-assembled borophene/graphene nanoribbon mixed-dimensional heterostructures and a method of synthesizing the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

Borophene has attracted intense research interest as an emerging synthetic two-dimensional (2D) material with unique structural characteristics and distinctive electronic properties including anisotropic metallicity, charge density wave phenomena, and predicted high-temperature superconductivity. Due to the diverse bonding motifs of boron, borophene also exhibits a high propensity for polymorphism, resulting in diverse lattice configurations and intermixing. As a true 2D metal, borophene distinguishes itself from zero bandgap semiconductors such as graphene and silicene in addition to finite bandgap semiconductors such as phosphorene.[10] In this regard, borophene is a particularly promising candidate for atomically thin electrical contacts to low-dimensional materials.

In parallel, bottom-up synthesis of one-dimensional (1D) graphene nanoribbons (GNRs) has been realized via surface-assisted Ullmann coupling of aromatic halide monomers. Following this approach, the width and edge topology of GNRs have been tailored with engineered precursor molecules, resulting in exquisite control over their electronic properties. Since Ag(111) has been used as a growth substrate for both borophene and GNRs, then it appears feasible that these low-dimensional materials can be integrated into mixed-dimensional metal-semiconductor lateral heterojunctions.

Previously demonstrated bottom-up synthesis of atomically thin lateral heterostructures has required compatible growth conditions in addition to interfacial lattice matching, which has been largely limited to graphene/hexagonal boron nitride (hBN) and $MoS_2/WSe_2$ systems. However, due to the polymorphic nature of boron, near-atomically abrupt lateral heterostructures have also been demonstrated for borophene and graphene despite imperfect crystallographic lattice and symmetry matching. This bonding flexibility coupled with the extra degree of freedom in a 2D/1D mixed-dimensional heterojunction compared to traditional 2D/2D heterojunctions further suggests that borophene and GNRs can be integrated with atomically abrupt heterointerfaces.

Therefore, a heretofore unaddressed need exists in the art to address the aforementioned deficiencies and inadequacies.

SUMMARY OF THE INVENTION

In one aspect, this invention relates to a method of synthesizing a self-assembled mixed-dimensional heterostructure. The method includes depositing boron on a substrate to grow borophene thereon at a substrate temperature in an ultrahigh vacuum (UHV) chamber; sequentially depositing 4,4"-dibromo-p-terphenyl (DBTP) on the borophene grown substrate at room temperature in the UHV chamber to form a composite structure; and controlling multi-step on-surface coupling reactions of the composite structure to self-assembling a borophene/graphene nanoribbon mixed-dimensional heterostructure.

In one embodiment, the UHV chamber has a base pressure $<10^{-9}$ Torr.

In one embodiment, the substrate comprises a substrate having a metal film formed of Ag, Au, Cu, Al, or Ir.

In one embodiment, the substrate comprises an atomically clean Ag(111) substrate having about 480-720 nm thick Ag(111) on a mica substrate.

In one embodiment, said depositing the boron is performed by electron-beam evaporation of a solid boron rod, or high temperature effusion of the solid boron rod in a high temperature effusion cell.

In one embodiment, the solid boron rod has a purity of about 99.999-99.99999% boron.

In one embodiment, the substrate temperature is at about 320-660° C. during boron deposition.

In one embodiment, the grown borophene comprises at least two distinct borophene phases with the $v_{1/6}$ and $v_{1/5}$ atomic structures.

In one embodiment, the $v_{1/6}$ phase borophene is characterized with a rectangular-shaped unit cell and parallel striped patterns with about 1.5 nm periodicity along a boron row direction, and wherein the $v_{1/5}$ phase borophene is characterized with a diamond-shaped unit cell with brick-wall patterns that originate from the staggered hollow hexagons in the $v_{1/5}$ borophene lattice.

In one embodiment, the grown borophene is atomically pristine borophene.

In one embodiment, said depositing the DBTP is performed by thermally evaporation of pure DBTP molecules in an alumina-coated crucible.

In one embodiment, the composite structure comprises a DBTP assembly including closely packed arrays of ordered DBTP monomers with different types of self-assembled structures on the borophene grown substrate, wherein the self-assembled structures possess brick-wall patterns with different packing densities.

In one embodiment, the Br atoms are detachable from the molecular precursors, wherein the detached Br atoms on Ag(111) play roles in stabilizing the self-assembled structures by forming lateral hydrogen bonds between Br and H atoms.

In one embodiment, said controlling the multi-step on-surface coupling reactions of the composite structure comprises annealing the composite structure at about 50° C. to form borophene/Ag(TP)$_n$ lateral heterostructures on the substrate, wherein Ag(TP)$_n$ is an organometallic intermediate Ag(Terphenyl)$_n$ and n is the number of coupled DBTP molecules, and wherein the Ag(TP)$_n$ chains assemble into ordered structures.

In one embodiment, by using the atomic structure of borophene as an orientational marker, the Ag(TP)$_n$ chains have a chain direction that is about 70° rotated from the boron row directions of the $v_{1/5}$ and $v_{1/6}$ phase borophene, corresponding to a 40° rotational angle with respect to the Ag(111) atomic chains.

In one embodiment, the preferential orientations of the Ag(TP)$_n$ chains are about 20° or about 40° rotated from the Ag(111) atomic chain direction.

In one embodiment, said controlling the multi-step on-surface coupling reactions of the composite structure further comprises annealing the borophene/Ag(TP)$_n$ lateral heterostructure on the substrate at about 200° C., resulting in aggregation of short Ag(TP)$_n$ chains into more extended structures, wherein a relatively sharp interface is achieved between Ag(TP)$_n$ and borophene, and the atomic lattice of borophene is preserved.

In one embodiment, the annealed borophene/Ag(TP)$_n$ lateral heterostructure comprises elemental composition and chemical bonding states including C—C/C—H bonds, C—Ag bond and lateral hydrogen bonds of C—Br interaction.

In one embodiment, at the borophene/Ag(TP)$_n$ heterointerface, an abrupt electronic transition between Ag(TP)$_n$ and borophene within about 1-2 nm occurs.

In one embodiment, said controlling the multi-step on-surface coupling reactions of the composite structure further comprises annealing the annealed borophene/Ag(TP)$_n$ lateral heterostructure on the substrate at about 250° C. to obtain the borophene/aGNR lateral heterostructure in which each triangular borophene domain is surrounded by ordered aGNR arrays.

In one embodiment, a width of the synthesized aGNRs is about 0.5 nm, which corresponds to ultra-narrow armchair-oriented graphene nanoribbons that are three carbon atoms wide (3-aGNRs), and the average distance between two adjacent 3-aGNRs is about 1.0 nm±0.1 nm, which corresponds to 2 Ag atomic spacings along the [11-2] direction.

In one embodiment, the borophene/aGNR lateral heterostructure has the apparently dimmer rows located between adjacent parallel 3-aGNRs including Br atoms.

In one embodiment, the orientation of the 3-aGNRs of the borophene/3-aGNR heterostructure is a 30° rotation angle with respect to the boron row direction in borophene, which is equivalent to the underlying Ag(111) atomic chain direction.

In one embodiment, the borophene/aGNR lateral heterostructure has distinct characteristics of metallic borophene on the borophene side, and a semiconducting bandgap on the 3-aGNR side.

In one embodiment, the metal-semiconductor heterojunction between borophene and 3-aGNRs is exceptionally electronically abrupt with no evidence of interface states.

In one embodiment, the mixed-dimensional heterostructure comprises 2D metallic borophene and 1D semiconducting armchair-oriented graphene nanoribbons (aGNRs).

In one aspect, this invention relates to a self-assembled mixed-dimensional heterostructure synthesized according to the above method.

In one aspect, this invention relates to a composition comprising a self-assembled mixed-dimensional heterostructure comprising 2D metallic borophene and 1D semiconducting armchair-oriented graphene nanoribbons (aGNRs).

In one embodiment, the self-assembled mixed-dimensional heterostructure comprises a borophene/aGNR lateral heterostructure including aligned, ultra-narrow 3-aGNRs with well-defined structural heterointerfaces with borophene.

In one embodiment, a width of the aGNRs is about 0.5 nm, and the average distance between two adjacent 3-aGNRs is about 1.0 nm±0.1 nm.

In one embodiment, the borophene/aGNR lateral heterostructure has the apparently dimmer rows located between adjacent parallel 3-aGNRs including Br atoms.

In one embodiment, the orientation of the 3-aGNRs is 30° rotated with respect to the boron row direction in borophene.

In one embodiment, the borophene/aGNR lateral heterostructure has distinct characteristics of metallic borophene on the borophene side, and a semiconducting bandgap on the 3-aGNR side.

In one embodiment, the metal-semiconductor heterojunction between borophene and 3-aGNRs is exceptionally electronically abrupt with no evidence of interface states.

These and other aspects of the present invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
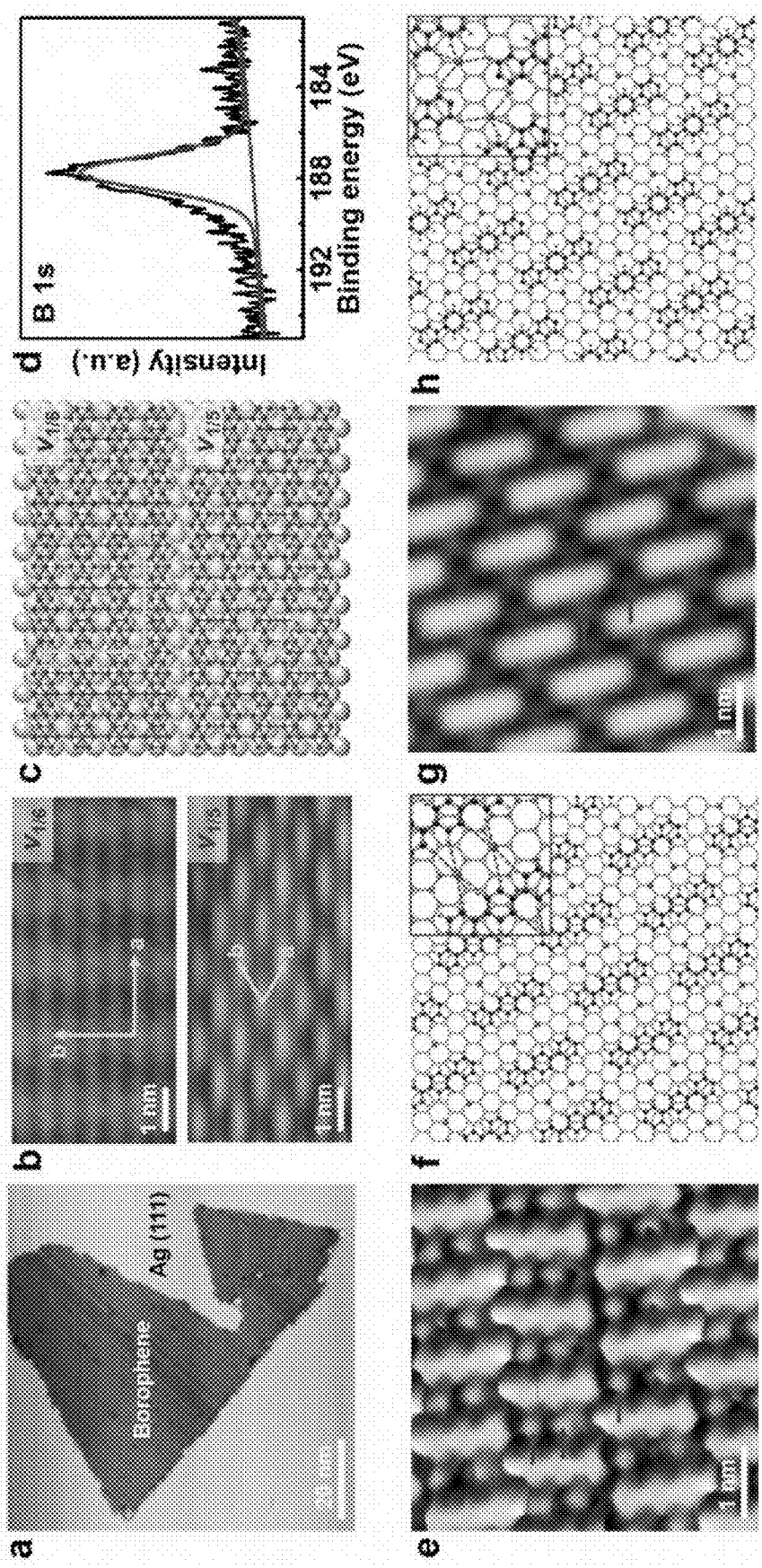
FIG. 1 shows mixed-phase $v_{1/6}$ and $v_{1/5}$ borophene and DBTP self-assembled structures on Ag(111), according to embodiments of the invention. Panel a: STM topography image of triangular borophene domains ($V_s=-0.39$ V, $I_t=70$ pA). Panel b: Atomic-resolution STM images of $v_{1/6}$ and $v_{1/5}$ borophene sheets with their unit cells marked with blue arrows (upper image: $V_s=-0.86$V, $I_t=30$ pA; lower image: $V_s=-0.44$ V, $I_t=100$ pA). Panel c: Corresponding structural models of $v_{1/6}$ and $v_{1/5}$ borophene sheets. Panel d: In-situ XPS spectrum of the B 1s core level on borophene. Panels e-h: Representative STM images and corresponding structural models of DBTP self-assembled structures with two typical arrangements, where the detached Br atoms are marked with red arrows (Panel e: $V_s$=44.6 mV, $I_t$=200 pA; Panel g: $V_s$=−0.54 V, $I_t$=180 pA).

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this specification will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term are the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures. is turned over, elements described as being on the "lower" side of other elements would then be oriented on "upper" sides of the other elements. The exemplary term "lower", can, therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this specification, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As used in this specification, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this specification, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in a different order (or concurrently) without altering the principles of the invention.

Atomically thin metal-semiconductor heterojunctions are highly desirable for nanoelectronic applications. However, coherent lateral stitching of distinct two-dimensional (2D) materials has traditionally required interfacial lattice matching and compatible growth conditions, which remains challenging for most systems. On the other hand, these constraints are relaxed in 2D/1D mixed-dimensional lateral heterostructures due to the increased structural degree of freedom.

This invention in one aspect discloses the self-assembly of mixed-dimensional lateral heterostructures including 2D metallic borophene and 1D semiconducting armchair-oriented graphene nanoribbons (aGNRs). With the sequential ultrahigh vacuum deposition of boron and 4,4"-dibromo-p-terphenyl as precursors on Ag(111) substrates, an on-surface polymerization process is systematically studied and refined including the transition from monomers to organometallic intermediates and finally demetallization that results in borophene/aGNR lateral heterostructures. High-resolution scanning tunneling microscopy and spectroscopy resolve the structurally and electronically abrupt interfaces in borophene/aGNR heterojunctions, thus providing insight that will inform ongoing efforts in pursuit of atomically precise nanoelectronics.

In another aspect, the invention relates to a method of synthesizing a self-assembled mixed-dimensional heterostructure. The method includes depositing boron on a substrate to grow borophene thereon at a substrate temperature in an ultrahigh vacuum (UHV) chamber; sequentially depositing 4,4"-dibromo-p-terphenyl (DBTP) on the borophene grown substrate at room temperature in the UHV chamber to form a composite structure; and controlling multi-step on-surface coupling reactions of the composite structure to self-assemble a borophene/graphene nanoribbon mixed-dimensional heterostructure.

In some embodiments, the UHV chamber has a base pressure $<10^{-9}$ Torr.

In some embodiments, the substrate comprises a substrate having a metal film formed of Ag, Au, Cu, Al, or Ir.

In some embodiments, the substrate comprises an atomically clean Ag(111) substrate having about 480-720 nm thick Ag(111) on a mica substrate.

In some embodiments, said depositing the boron is performed by electron-beam evaporation of a solid boron rod, or high temperature effusion of the solid boron rod in a high temperature effusion cell.

In some embodiments, the solid boron rod has a purity of about 99.999-99.99999% boron.

In some embodiments, the substrate temperature is at about 320-660° C. during boron deposition.

In some embodiments, the grown borophene comprises at least two distinct borophene phases with the $v_{1/6}$ and $v_{1/5}$ atomic structures.

In some embodiment, the $v_{1/6}$ phase borophene is characterized with a rectangular-shaped unit cell and parallel striped patterns with about 1.5 nm periodicity along a boron row direction, and wherein the $v_{1/5}$ phase borophene is characterized with a diamond-shaped unit cell with brick-wall patterns that originate from the staggered hollow hexagons in the $v_{1/5}$ borophene lattice.

In some embodiments, the grown borophene is atomically pristine borophene.

In some embodiments, said depositing the DBTP is performed by thermally evaporation of pure DBTP molecules in an alumina-coated crucible.

In some embodiments, the composite structure comprises a DBTP assembly including closely packed arrays of ordered DBTP monomers with different types of self-assembled structures on the borophene grown substrate, wherein the self-assembled structures possess brick-wall patterns with different packing densities.

In some embodiments, the Br atoms are detachable from the molecular precursors, wherein the detached Br atoms on Ag(111) play roles in stabilizing the self-assembled structures by forming lateral hydrogen bonds between Br and H atoms.

In some embodiments, said controlling the multi-step on-surface coupling reactions of the composite structure comprises annealing the composite structure at about 50° C. to form borophene/Ag(TP)$_n$ lateral heterostructures on the substrate, where Ag(TP)$_n$ is an organometallic intermediate Ag(Terphenyl)$_n$ and n is the number of coupled DBTP molecules, and the Ag(TP)$_n$ chains assemble into ordered structures.

In some embodiments, by using the atomic structure of borophene as an orientational marker, the Ag(TP)$_n$ chains have a chain direction that is about 70° rotated from the boron row directions of the $v_{1/5}$ and $v_{1/6}$ phase borophene, corresponding to a 40° rotational angle with respect to the Ag(111) atomic chains.

In some embodiments, the preferential orientations of the Ag(TP)$_n$ chains are about 20° or about 40° rotated from the Ag(111) atomic chain direction.

In some embodiments, said controlling the multi-step on-surface coupling reactions of the composite structure further comprises annealing the borophene/Ag(TP)$_n$ lateral heterostructure on the substrate at about 200° C., resulting in aggregation of short Ag(TP)$_n$ chains into more extended structures, wherein a relatively sharp interface is achieved between Ag(TP)$_n$ and borophene, and the atomic lattice of borophene is preserved.

In some embodiments, the annealed borophene/Ag(TP)$_n$ lateral heterostructure comprises elemental composition and chemical bonding states including C—C/C—H bonds, C—Ag bond and lateral hydrogen bonds of C—Br interaction.

In some embodiments, at the borophene/Ag(TP)$_n$ heterointerface, an abrupt electronic transition between Ag(TP)$_n$ and borophene within about 1-2 nm occurs.

In some embodiments, said controlling the multi-step on-surface coupling reactions of the composite structure further comprises annealing the annealed borophene/Ag (TP)$_n$ lateral heterostructure on the substrate at about 250° C. to obtain the borophene/aGNR lateral heterostructure in which each triangular borophene domain is surrounded by ordered aGNR arrays.

In some embodiments, a width of the synthesized aGNRs is about 0.5 nm, which corresponds to ultra-narrow armchair-oriented graphene nanoribbons that are three carbon atoms wide (3-aGNRs), and the average distance between two adjacent 3-aGNRs is about 1.0 nm±0.1 nm, which corresponds to 2 Ag atomic spacings along the [11-2] direction.

In some embodiments, the borophene/aGNR lateral heterostructure has the apparently dimmer rows located between adjacent parallel 3-aGNRs including Br atoms.

In some embodiments, the orientation of the 3-aGNRs of the borophene/3-aGNR heterostructure is 30° rotated with respect to the boron row direction in borophene, which is equivalent to the underlying Ag(111) atomic chain direction.

In some embodiments, the borophene/aGNR lateral heterostructure has distinct characteristics of metallic borophene on the borophene side, and a semiconducting bandgap on the 3-aGNR side.

In some embodiments, the metal-semiconductor heterojunction between borophene and 3-aGNRs is exceptionally electronically abrupt with no evidence of interface states.

In some embodiments, the mixed-dimensional heterostructure comprises 2D metallic borophene and 1D semiconducting armchair-oriented graphene nanoribbons (aGNRs).

In one aspect, this invention relates to a self-assembled mixed-dimensional heterostructure synthesized according to the above method.

In another aspect, this invention relates to a composition comprising a self-assembled mixed-dimensional heterostructure comprising 2D metallic borophene and 1D semiconducting armchair-oriented graphene nanoribbons (aGNRs).

In some embodiments, the self-assembled mixed-dimensional heterostructure comprises a borophene/aGNR lateral heterostructure including aligned, ultra-narrow 3-aGNRs with well-defined structural heterointerfaces with borophene.

In some embodiments, a width of the aGNRs is about 0.5 nm, and the average distance between two adjacent 3-aGNRs is about 1.0 nm±0.1 nm.

In some embodiments, the borophene/aGNR lateral heterostructure has the apparently dimmer rows located between adjacent parallel 3-aGNRs including Br atoms.

In some embodiments, the orientation of the 3-aGNRs is 30° rotated with respect to the boron row direction in borophene.

In some embodiments, the borophene/aGNR lateral heterostructure has distinct characteristics of metallic borophene on the borophene side, and a semiconducting bandgap on the 3-aGNR side.

In some embodiments, the metal-semiconductor heterojunction between borophene and 3-aGNRs is exceptionally electronically abrupt with no evidence of interface states.

Among other things, the invention provides a number of advantages. Previously demonstrated bottom-up synthesis of atomically thin lateral heterostructures has required compatible growth conditions in addition to interfacial lattice matching, resulting in very limited examples of 2D lateral heterostructures. The invention is not limited to traditional 2D/2D heterojunctions. It is the first integration of borophene with aGNRs, which takes advantage of the extra degree of freedom in 2D/1D mixed-dimensional heterojunctions. Due to the bonding flexibility of borophene and the precision of on-surface polymerization of aGNRs, nearly atomically abrupt interfaces were formed in borophene/3-aGNR lateral heterostructures. The metal-semiconductor heterojunction between borophene and 3-aGNRs is exceptionally electronically abrupt with no evidence of interface states, thus making it a promising building block for atomically precise nanoelectronics.

This invention among other things achieves the synthesis of borophene/aGNR lateral heterostructures, and more generally, 2D/1D lateral heterostructures involving synthetic materials. The resulting metal-semiconductor heterojunctions between borophene and 3-aGNRs are promising building blocks for atomically precise nanoelectronics. With this invention, synthetic mixed-dimensional borophene/3-aGNR lateral heterostructures can be used as building blocks in the fields of nanoelectronics, optoelectronics, sensing, energy-harvesting, quantum information, and related technologies.

The realization of the self-assembled borophene/graphene nanoribbon mixed-dimensional heterostructures make it more suitable for applications in, but not limited to, thin-film transistors, optoelectronics, high frequency logic, sensing, energy conversion and storage, quantum information technologies, wearable physiological monitors, and related technologies.

This invention is a critical step in the pursuit of atomically precise nanoelectronics.

These and other aspects of the invention are further described below. Without intent to limit the scope of the invention, exemplary instruments, apparatus, methods, and their related results according to the embodiments of the invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Example

Self-Assembled Borophene/Graphene Nanoribbon Mixed-Dimensional Heterostructures

This exemplary study discloses the self-assembly of mixed-dimensional heterostructures of 2D metallic borophene and 1D semiconducting armchair-oriented graphene nanoribbons (aGNRs) by the sequential deposition of boron and 4,4"-dibromo-p-terphenyl (DBTP) on Ag(111) followed by controlled post-annealing in ultrahigh vacuum (UHV). Using high-resolution scanning tunneling microscopy (STM) coupled with X-ray photoelectron spectroscopy (XPS), each stage of aGNR formation is tracked including the evolution from monomers to organometallic intermediates and finally demetallization that results in borophene/aGNR lateral heterostructures. Spatially resolved scanning tunneling spectroscopy (STS) confirms that the borophene/aGNR heterointerface is electronically abrupt, thus demonstrating that this mixed-dimensional system results in an atomically well-defined metal-semiconductor heterojunction.

Growth of borophene/aGNR lateral heterostructures: All growth was performed in a UHV preparation chamber with base pressure that is less than $10^{-9}$ Torr. The Ag(111)/mica substrates (600 nm thick Ag(111) thin films, Princeton Scientific Corp.) were cleaned by repeated Ar$^+$ ion sputtering and post-annealing at 550° C. Boron deposition was achieved by electron-beam evaporation (SPECS EBE-1, Focus EFM3) of a pure boron rod (ESPI Metals, 99.9999% purity) onto an atomically clean Ag(111) surface heated to 450° C. The deposition of DBTP was achieved by thermally evaporating pure DBTP molecules (Sigma-Aldrich, 97% purity) in an alumina-coated crucible (R. D. Mathis) with a heating current of 2.5 A. The as-grown sub-monolayer borophene sample was held at room temperature during molecular deposition.

STM/STS measurements: A home-built UHV-STM system was used for STM/STS characterization at room temperature with electrochemically etched Pt—Ir tips (Keysight Technologies). STM characterization with CO-functionalized tips was carried out using an Omicron LT-STM system at 4 K. The STS local differential tunneling conductance (dI/dV) spectra were measured with a lock-in amplifier (SRS model SR850).

X-ray photoelectron spectroscopy: In-situ XPS spectra were taken with an Omicron DAR 400 M X-ray source (Al Kα), an XM 500 X-ray monochromator, and an EA 125 energy analyzer in a UHV chamber with a base pressure of $3\times10^{-10}$ Torr. The XPS energy resolution was 0.6 eV using a pass energy of 20 eV for core level spectra.

In certain embodiments, borophene was grown on Ag(111)/mica substrates by direct electron-beam evaporation of a pure boron rod at a substrate growth temperature of about 450° C.

Panel a of FIG. 1 shows an STM image of triangular borophene islands, which appear as depressions under these imaging conditions, consistent with previous reports. Two distinct borophene phases with the $v_{1/6}$ and $v_{1/5}$ atomic structures are revealed in the high-resolution STM images of panel b of FIG. 1 and illustrated with the corresponding structural models in panel c of FIG. 1. The $v_{1/6}$ phase is characterized with a rectangular-shaped unit cell and parallel striped patterns with about 1.5 nm periodicity along the boron row direction (i.e., the horizontal direction in panel b of FIG. 1). On the other hand, the $v_{1/5}$ phase possesses a diamond-shaped unit cell with brick-wall patterns (lower sub-panel in panel b of FIG. 1), which originate from the staggered hollow hexagons in the $v_{1/5}$ borophene lattice (lower sub-panel in panel c of FIG. 1). These distinct borophene phases on Ag(111) result from preferentially aligned stacking registry with boron rows that are 30° rotated with respect to the Ag<1-10> crystallographic directions (directions of the Ag atomic chains) at this growth temperature, as sketched in panel c of FIG. 1.

Figure 5:
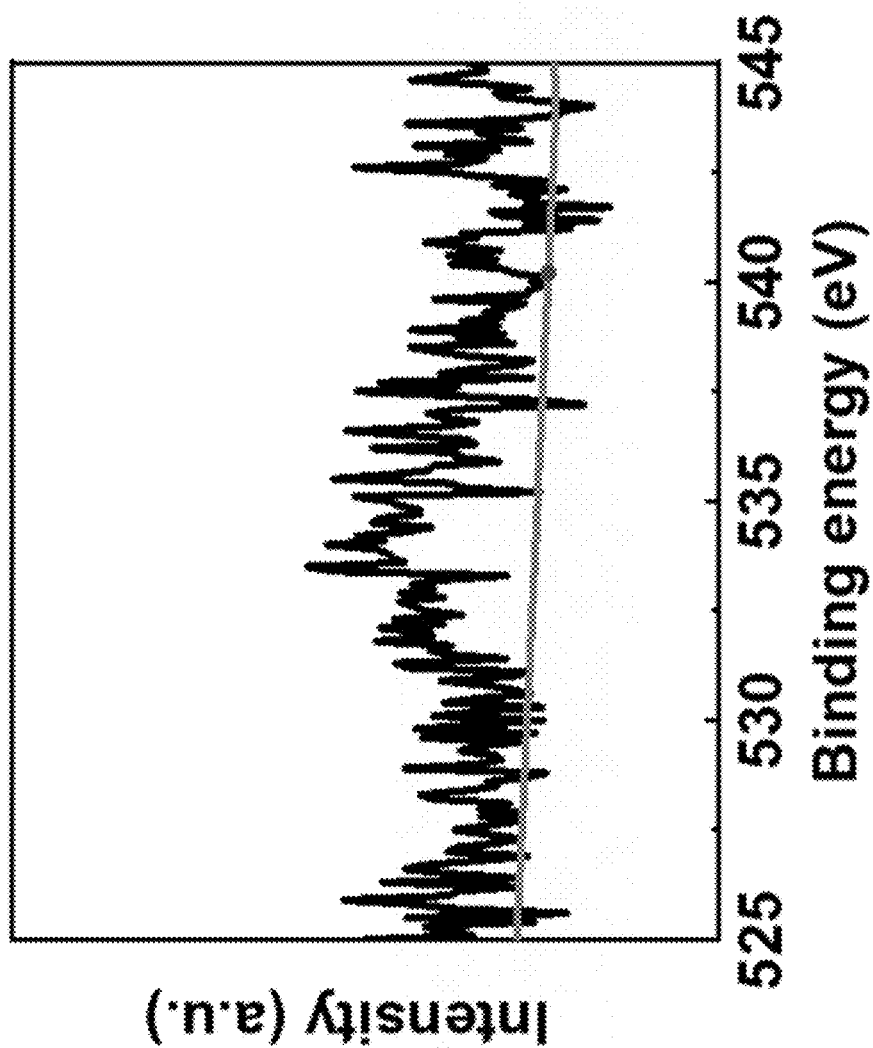
FIG. 5 shows in-situ XPS spectrum of the 0 is core level on borophene, according to embodiments of the invention.

As shown in panel d of FIG. 1, in-situ XPS of the B is core level shows a peak located at 187.7 eV, corresponding to B—B bonds. The absence of the B—O peak in the B is spectrum (about 192 eV) and oxygen peak in the O 1s core level spectrum (FIG. 5) further confirms the atomically pristine nature of the as-synthesized borophene.

Figure 6:
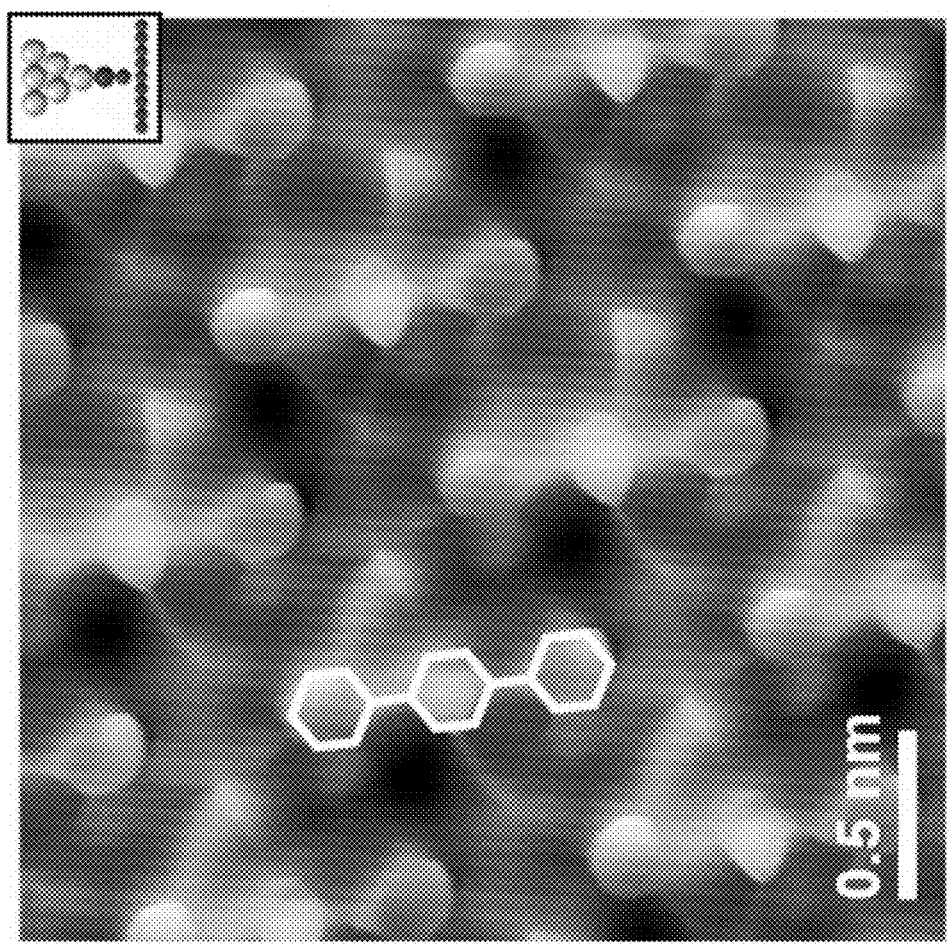
FIG. 6 shows CO-STM image of DBTP structures with overlaid atomic structure of three benzene rings ($V_s$=8.6 mV, $I_t$=120 pA), according to embodiments of the invention.

The deposition of DBTP at room temperature on Ag(111) was realized with an alumina-coated crucible in close proximity to the substrate at a distance of about 1 cm. Following DBTP evaporation, closely packed arrays of ordered DBTP monomers were observed on Ag (111), with two types of self-assembled structures as shown in panels e and g of FIG. 1. Both structures possess brick-wall patterns with different packing densities, which is consistent with the published results of DBTP assembly on Au(111). With STM tips functionalized with carbon monoxide (CO), the DBTP assembly structure was imaged at a higher spatial resolution, revealing the three benzene rings in each DBTP molecule, as shown in FIG. 6. The average distances between two adjacent molecules were measured to be 1.0 nm (panel c of FIG. 1, Type I) and 0.75 nm (panel g of FIG. 1, Type II) with an error range of ±0.05 nm, corresponding to 2 Ag and 1.5 Ag atomic spacings along the [11-2] direction, respectively. Based on the measured lateral distances and the previously reported DBTP structures on Au(111), the likely stacking registry of DBTP on Ag (111) is shown in panels f and h of FIG. 1 with the DBTP molecules lying along the Ag atomic chain direction. These novel structures suggest stacking registry of DBTP and Br atoms with the underlying Ag(111) substrate, wherein this registry can be relaxed with lateral displacement from hollow sites to top or bridge sites on Ag(111). Faint protrusions (marked with red arrows in panels e and g of FIG. 1) were observed between the adjacent monomers, which are believed to be Br atoms detached from the molecular precursors. Previous studies have shown that the detached Br atoms on Ag(111) play important roles in stabilizing self-assembled structures by forming lateral hydrogen bonds between Br and H atoms, as sketched in the insets of panels f and h of FIG. 1.

Figure 2:
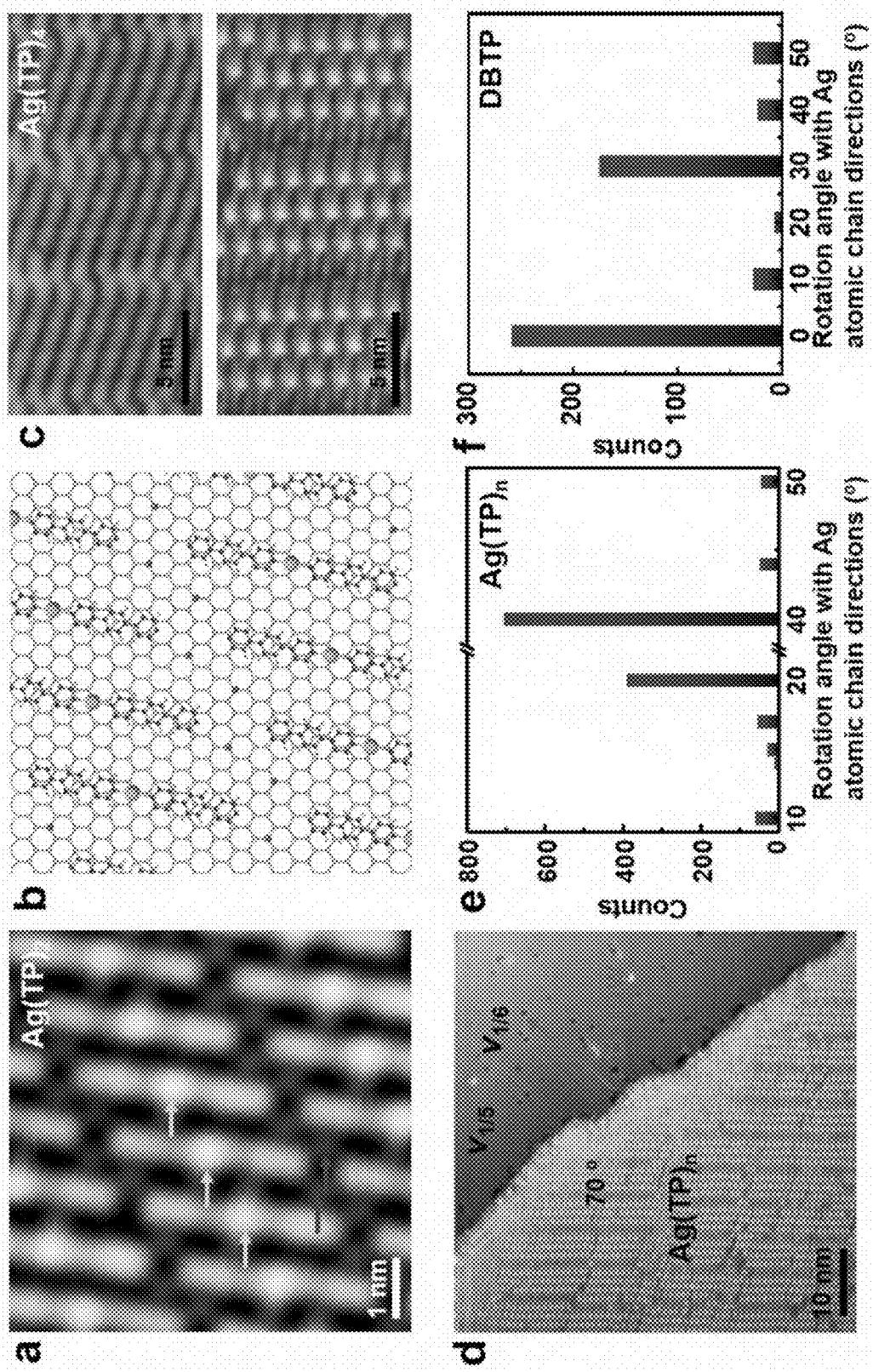
FIG. 2 shows self-assembly of Ag(TP)$_n$ on Ag(111) and lateral heterostructures with borophene, according to embodiments of the invention. Panel a: STM image of Ag(TP)$_2$ self-assembled structures, with Ag bridging atoms marked with blue arrows and detached Br atoms marked with red arrows ($V_s$=8.6 mV, $I_t$=120 pA). Panel b: Structural model of coupled Ag(TP)$_2$ self-assembled structures. Panel c: STM images of Ag(TP)$_4$ self-assembled structures with rod-like features or dotted protrusions under different tunneling conditions (upper image: $V_s$=−0.63V, $I_t$=100 pA; lower image: $V_s$=−0.83 V, $I_t$=100 pA). Panel d: STM image of self-assembled borophene/Ag(TP)$_n$ lateral heterostructures ($V_s$=−0.83 V, $I_t$=100 pA), with the boron row orientation marked with a green arrow and the Ag(TP)$_n$ chain orientation marked with a pink arrow. Panels e-f: Histograms of Ag(TP)$_n$ and DBTP rotation angles with respect to the Ag(111) atomic chain direction, respectively.

After mild annealing at 50° C., the dehalogenated monomers undergo an on-surface Ullmann coupling reaction to form more extended nanostructures. Similar oligomer intermediates with metal atoms as bridges have been observed in previous studies, with the details of these oligomer intermediates altering the pathways and dynamics of the coupling reaction. In this exemplary example, the organometallic intermediates are identified as Ag(Terphenyl)$_n$, abbreviated as Ag(TP)$_n$, where n is the number of coupled DBTP molecules. Panel a of FIG. 2 shows an STM image of Ag(TP)$_2$ structures with a chain length of about 3.3 nm, where the bright protrusions in the middle (marked with blue arrows) are assigned to Ag adatoms involved in organometallic intermediates. Similar to the DBTP monomers, the Ag(TP)$_n$ chains also assemble into ordered structures, as sketched in the inset of panel b of FIG. 2. In panel c of FIG. 2, longer Ag(TP)$_4$ structures are imaged as rod-like structures with an average length of about 6.6 nm (upper panel) or three protrusions decorated inside a chain (lower panel) depending on the scanning conditions.

Figure 7:
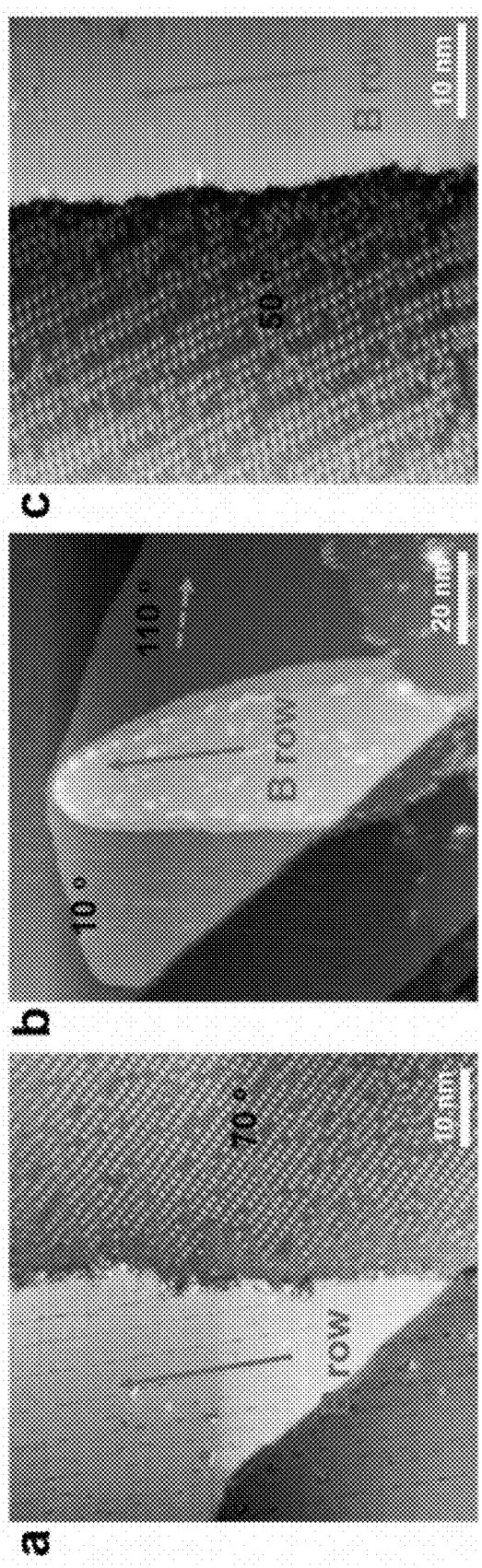
FIG. 7 shows STM images of borophene/Ag(TP)$_n$ lateral heterostructures, according to embodiments of the invention, with boron rows marked with green arrows and Ag(TP)$_n$ chain orientation marked with pink arrows (Panel a: $V_s$=−0.8 V, $I_t$=50 pA; Panel b: $V_s$=−0.9 V, $I_t$=30 pA; Panel c: $V_s$=−0.4 V, $I_t$=50 pA). The rotation angles between boron row and Ag(TP)$_n$ domains were measured to be 70°, 10°, 110°, and 50°, which is equivalent to a 20° or 40° rotation angle between the Ag(TP)$_n$ domains and Ag atomic chains.
Figure 8:
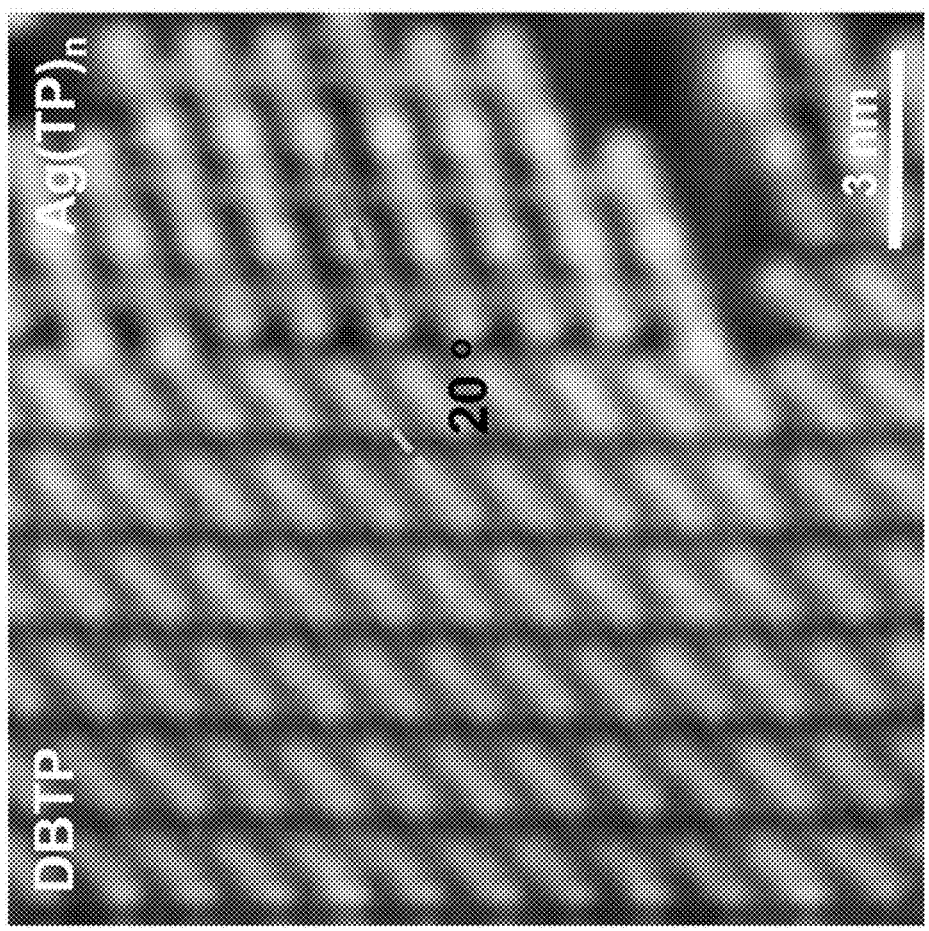
FIG. 8 shows an STM image of a boundary between DBTP and Ag(TP)$_n$ domains with distinct orientations ($V_s$=−0.8 V, $I_t$=90 pA), according to embodiments of the invention.
Figure 9:
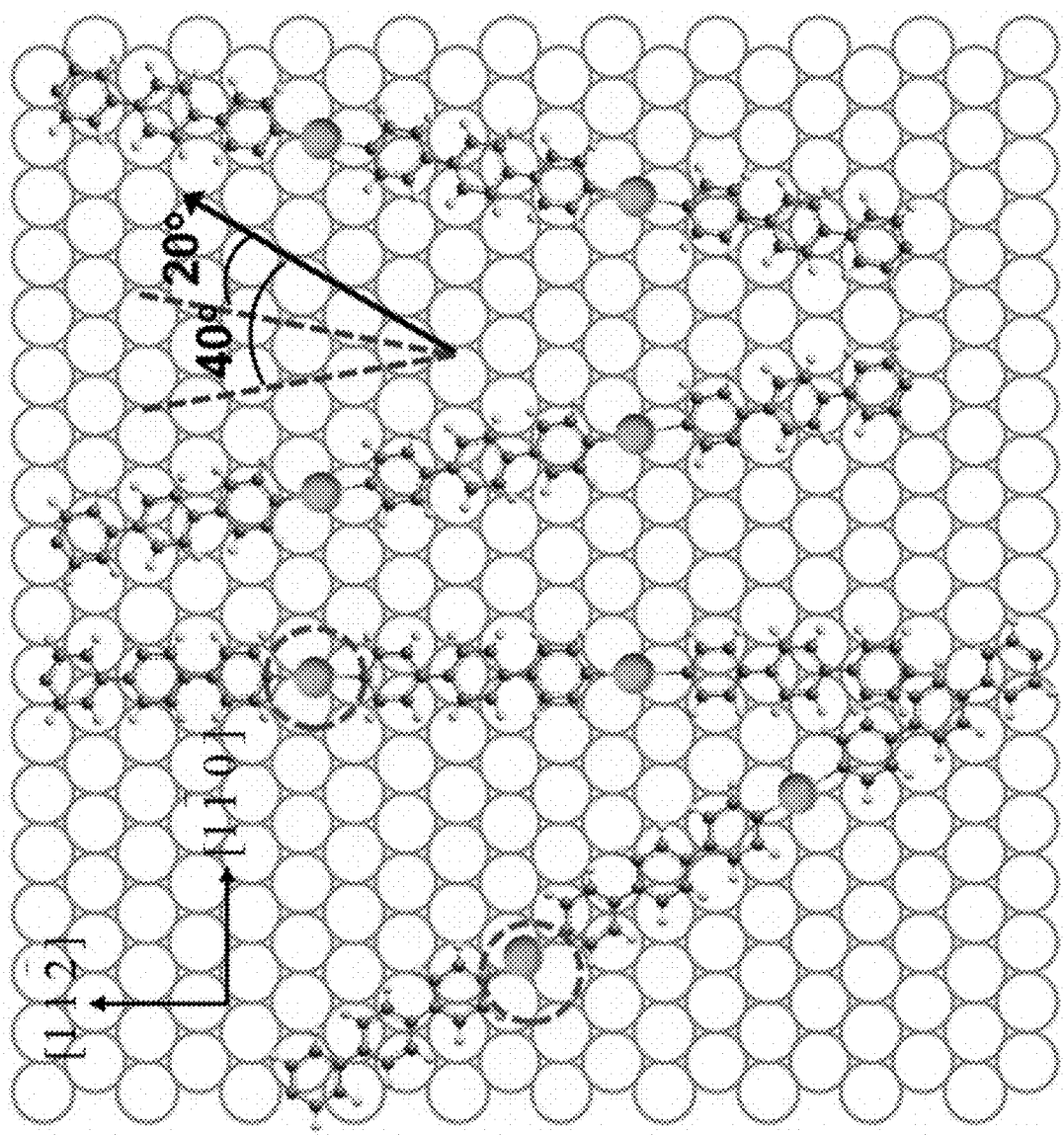
FIG. 9 shows a structural model of Ag(TP)$_n$ chains on Ag(111) with various orientations, according to embodiments of the invention. Only orientations of about 20° or about 40° rotated from the Ag atomic chain direction are able to locate the Ag adatoms on the hollow sites of Ag(111).

Borophene/Ag(TP)$_n$ lateral heterostructures were achieved by evaporating DBTP on sub-monolayer borophene on Ag(111). Panel d of FIG. 2 shows an STM image of a representative borophene/Ag(TP)$_n$ lateral heterostructure, indicating that DBTP molecules preferentially adsorb on the Ag(111) surface. This observation is consistent with previous work that found preferential assembly of perylene-based molecules on Ag(111) compared to borophene, resulting in self-assembled borophene-organic lateral heterostructures. By using the atomic structure of borophene as an orientational marker, the Ag(TP)$_n$ domain in panel d of FIG. 2 shows a chain direction that is 70° rotated from the boron row directions of $v_{1/5}$ and $v_{1/6}$ phase borophene, corresponding to a 40° rotational angle with respect to the Ag(111) atomic chains. A series of STM images (FIG. 7) allow orientational histograms to be constructed (panel e of FIG. 2), which indicate that the preferential orientations of Ag(TP)$_n$ chains are about 20° or about 40° rotated from the Ag(111) atomic chain direction. This preferential orientation of Ag(TP)$_n$ is different from that of DBTP monomers with aligned or 30° rotation with respect to the Ag(111) atomic chains (panel f of FIG. 2), which is corroborated by STM images of adjacent self-assembled Ag(TP)$_n$ and DBTP domains with distinct orientations (FIG. 8). The rotational realignment from DBTP to Ag(TP)$_n$ is possibly driven by the insertion of Ag atoms in the coupling process, which tend to be located at the hollow sites of Ag(111). In this case, the orientation of the Ag(TP)$_n$ chains on Ag(111) is inconsistent with Ag atoms on the hollow sites, thus leading to an inclined orientation to stabilize the self-assembled structure (details discussed in FIG. 9).

Figure 3:
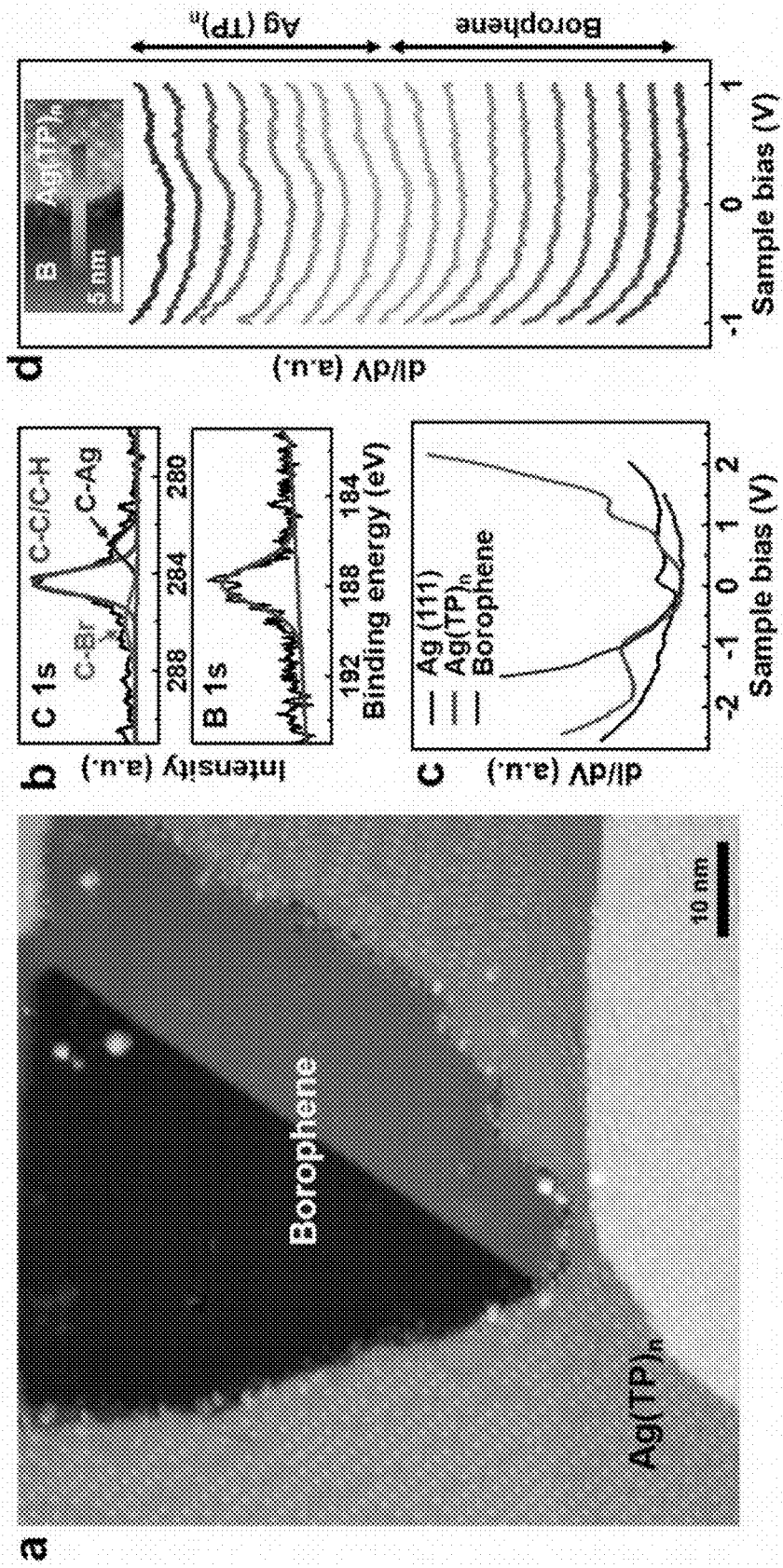
FIG. 3 shows lateral heterostructures of borophene/Ag (TP)$_n$ chains after annealing at 200° C., according to embodiments of the invention. Panel a: Large-scale STM image of a borophene/Ag(TP)$_n$ lateral heterostructure ($V_s$=−0.8 V, $I_t$=50 pA). Panel b: In-situ XPS spectra of the C1s and B1s core levels for borophene/Ag(TP)$_n$ lateral heterostructures. Panel c: STS spectra of Ag(111), Ag(TP)$_n$, and borophene. Panel d: Spatially resolved STS spectra obtained across a borophene/Ag(TP)$_n$ heterointerface with lateral displacements of 0.5 nm between adjacent spectra.
Figure 10:
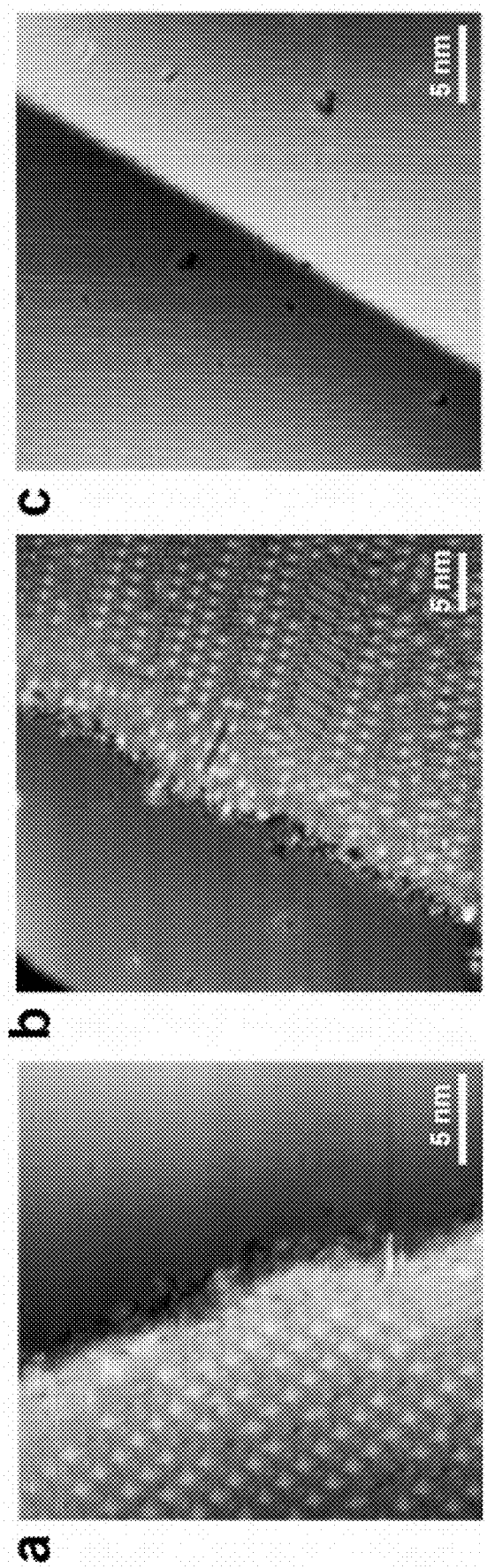
FIG. 10 shows STM images showing the borophene/Ag (TP)$_n$ heterointerface and atomic lattice of borophene domains, according to embodiments of the invention. Panel a: $V_s$=−0.6 V, $I_t$=50 pA; Panel b: $V_s$=−0.7 V, $I_t$=50 pA; Panel c: $V_s$=−0.2 V, $I_t$=50 pA.

Further annealing the sample at 200° C. results in the aggregation of short Ag(TP)$_n$ chains into more extended structures as shown in panel a of FIG. 3. A relatively sharp interface is achieved between Ag(TP)$_n$ and borophene, and the atomic lattice of borophene is preserved, as shown in the high-resolution STM images in FIG. 10. The elemental composition and chemical bonding states in the borophene/Ag(TP)$_n$ lateral heterostructure were confirmed with in-situ XPS in panel b of FIG. 3. The C 1s core level spectrum can be fit into three sub-peaks at 282.9 eV, 284.4 eV, and 286.1 eV, respectively. The intense C 1s peak in red is attributed to the C—C/C—H bonds in DBTP, with the two small peaks in blue and pink representing the C—Ag bonds in Ag(TP)$_n$ and the C—Br interaction in the lateral hydrogen bonds, respectively. Meanwhile, the B 1s core level spectrum includes a predominant peak located at 187.7 eV. The electronic properties of the borophene/Ag(TP)$_n$ heterostructures are further probed with STS. In panel c of FIG. 3, the STS spectra obtained on clean Ag, borophene, and Ag(TP)$_n$ are displayed with black, blue, and red lines, respectively. The STS spectrum on Ag(TP)$_n$ shows a gap-like feature, in contrast to the metallic spectra for borophene and Ag. STS data for Ag(TP)$_n$ hybrid chains with different length showed similar results, which is consistent with prior reports for Ag(TP)$_3$ structures. Spatially resolved STS spectra across the borophene/Ag(TP)$_n$ heterointerface (panel d of FIG. 3) show an abrupt electronic transition between Ag(TP)$_n$ and borophene within 1-2 nm.

Figure 11:
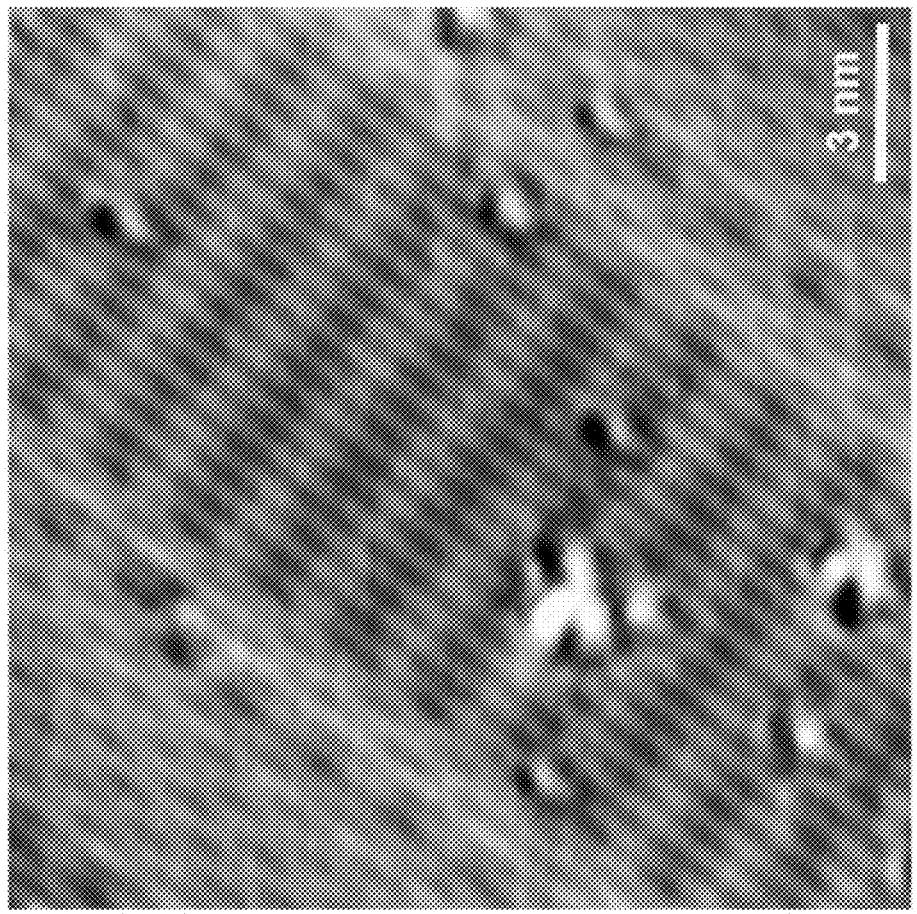
FIG. 11 shows an STM image of the borophene lattice in a borophene/3-aGNR lateral heterostructure ($V_s$=−0.4 V, $I_t$=100 pA), according to embodiments of the invention.
Figure 12:
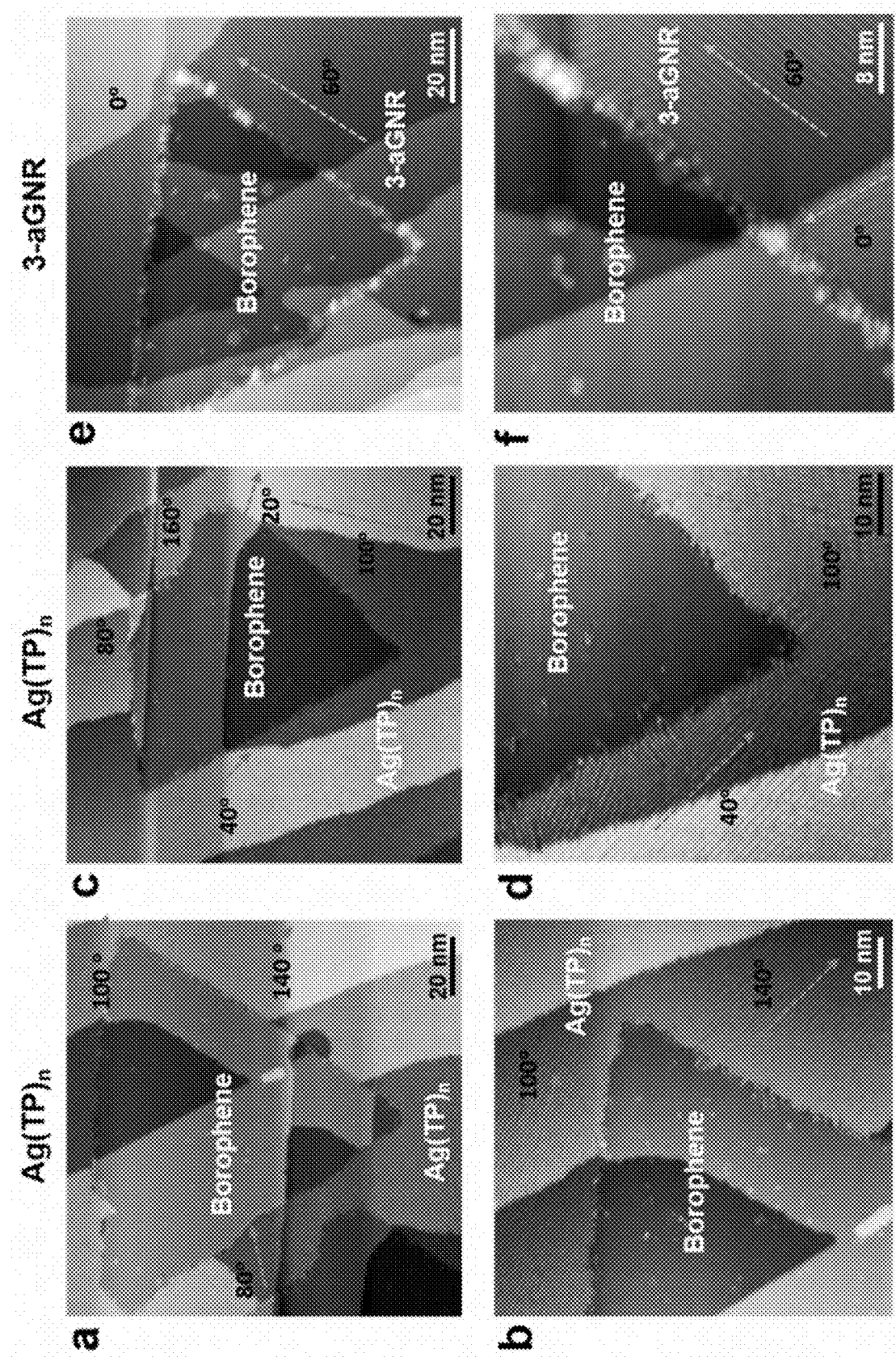
FIG. 12 shows direct comparison of the preferential orientations of borophene/3-aGNR and borophene/Ag(TP)$_n$ lateral heterostructures, according to embodiments of the invention. The Ag(TP)$_n$ structures are about 20° or about 40° rotated from the Ag atomic chain direction, whereas the 3-aGNRs are aligned with the Ag atomic chain direction.

To obtain the final borophene/aGNR lateral heterostructures, a full demetallization process of Ag(TP)$_n$ is required by annealing the sample at a higher temperature of about 250° C. The result is shown in panel a of FIG. 4, with a triangular borophene domain surrounded by ordered aGNR arrays. The width of the synthesized aGNRs was measured to be about 0.5 nm (panel b of FIG. 4), which corresponds to ultra-narrow armchair-oriented graphene nanoribbons that are three carbon atoms wide (3-aGNRs). The average distance between two adjacent 3-aGNRs was measured to be 1.0 nm±0.1 nm, corresponding to 2 Ag atomic spacings along the [11-2] direction. The apparently dimmer rows located between adjacent parallel 3-aGNRs are likely to include Br atoms, as schematically depicted in panel cb of FIG. 4. From the high-resolution STM images of 3-aGNRs (panel b of FIG. 4) and adjacent borophene (FIG. 11), the orientation of the 3-aGNRs shows a 30° rotation angle with respect to the boron row direction in borophene, which is equivalent to the underlying Ag(111) atomic chain direction. This orientation is significantly different from that of the Ag(TP)$_n$ chains with inclined arrangements preceding demetallization, which is evidenced with the direct comparison of borophene/3-aGNR and borophene/Ag(TP)$_n$ heterostructures included in FIG. 12.

Figure 4:
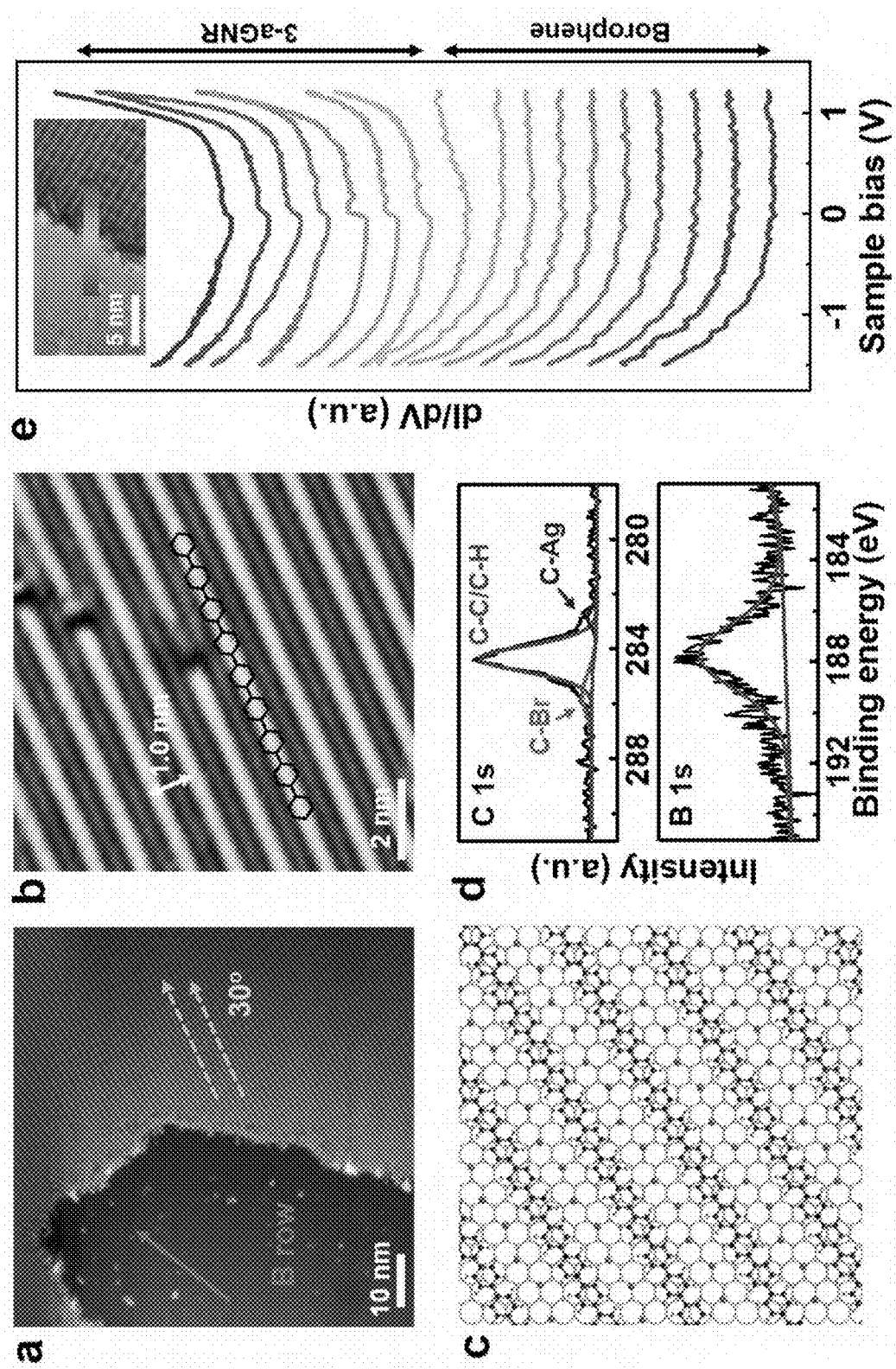
FIG. 4 shows borophene/3-aGNR lateral heterostructures, according to embodiments of the invention. Panel a: Large-scale STM image of a borophene/3-GNR lateral heterostructure ($V_s$=−0.74 V, $I_t$=50 pA). Panel b: High-resolution STM image of 3-aGNRs ($V_s$=−1.21 V, $I_t$=50 pA). The red arrows indicate apparently dimmer rows between adjacent parallel 3-aGNRs that are likely to be rows of Br atoms. Panel c: Structural model of 3-aGNR self-assembled structures including detached Br atoms. Panel d: In-situ XPS spectra of C1s and B1s core levels for borophene/3-aGNR lateral heterostructures. Panel e: Spatially resolved STS spectra obtained across a borophene/3-aGNR heterointerface with lateral displacements of 0.5 nm between adjacent spectra.

In addition to driving rotational realignment, demetallization results in a significantly attenuated sub-peak at 282.9 eV (C—Ag bonds) in the C 1s core level spectrum in panel d of FIG. 4, while the B 1s core level spectrum remains unchanged. Spatially resolved STS spectra across the borophene/3-aGNR heterointerface are displayed in panel e of FIG. 4. The STS spectra taken on the borophene side of the heterojunction show distinct characteristics of metallic borophene. On the other hand, the STS spectra taken on the 3-aGNR side of the heterojunction show a semiconducting bandgap with the Ag surface state apparent at approximately −60 meV, particularly on sites between adjacent 3-aGNRs. Again, the heterointerface between borophene and 3-aGNRs shows an electronically abrupt transition within about 1 nm. Compared to the relative large electronic transition distances in conventional 2D lateral heterostructures that result from compositional intermixing or edge/interfacial states, borophene/3-aGNR metal-semiconductor heterostructures exhibit exceptionally abrupt electronic interfaces with no apparent interface states.

In summary, the self-assembly of borophene/3-aGNR lateral heterostructures were achieved by the sequential deposition of boron and DBTP on Ag(111) followed by controlled multi-step on-surface coupling reactions. The detailed structures of DBTP monomers and Ag(TP)$_n$ intermediates on Ag(111) were identified and tracked with STM and XPS. The demetallization of Ag(TP)$_n$ resulted in aligned, ultra-narrow 3-aGNRs with well-defined structural heterointerfaces with borophene. Furthermore, spatially resolved STS measurements confirm that the metal-semiconductor heterojunction between borophene and 3-aGNRs is exceptionally electronically abrupt with no evidence of interface states. This work reveals that self-assembled mixed-dimensional borophene/3-aGNR lateral heterostructures are promising building blocks for atomically precise nanoelectronics.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications, and various publications, are cited and discussed in the description of this invention. The citation and/or discussion of such references is provided merely to clarify the description of the invention and is not an admission that any such reference is "prior art" to the invention described herein. All references cited and discussed in this specification are incorporated herein by reference in their entireties and to the same extent as if each reference was individually incorporated by reference.

LIST OF REFERENCES

[1]. Mannix, A. J.; Zhou, X.-F.; Kiraly, B.; Wood, J. D.; Alducin, D.; Myers, B. D.; Liu, X.; Fisher, B. L.; Santiago, U.; Guest, J. R.; Yacaman, M. J.; Ponce, A.; Oganov, A. R.; Hersam, M. C.; Guisinger, N. P. Synthesis of Borophenes: Anisotropic, Two-Dimensional Boron Polymorphs. *Science* 2015, 350, 1513-1516.

[2]. Mannix, A. J.; Zhang, Z.; Guisinger, N. P.; Yakobson, B. I.; Hersam, M. C. Borophene as a Prototype for Synthetic 2D Materials Development. *Nat. Nanotechnol.* 2018, 13, 444-450.

[3]. Liu, X.; Zhang, Z.; Wang, L.; Yakobson, B. I.; Hersam, M. C. Intermixing and Periodic Self-Assembly of Borophene Line Defects. *Nat. Mater.* 2018, 17, 783-788.

[4]. Penev, E. S.; Kutana, A.; Yakobson, B. I. Can Two-Dimensional Boron Superconduct? *Nano Lett.* 2016, 16, 2522-2526.

[5]. Penev, E. S.; Bhowmick, S.; Sadrzadeh, A.; Yakobson, B. I. Polymorphism of Two-Dimensional Boron. *Nano Lett.* 2012, 12, 2441-2445.

[6]. Feng, B.; Zhang, J.; Zhong, Q.; Li, W.; Li, S.; Li, H.; Cheng, P.; Meng, S.; Chen, L.; Wu, K. Experimental Realization of Two-Dimensional Boron Sheets. *Nat. Chem.* 2016, 8, 563-568.

[7]. Liu, X.; Wang, L.; Li, S.; Rahn, M. S.; Yakobson, B. I.; Hersam, M. C. Geometric Imaging of Borophene Polymorphs with Functionalized Probes. *Nat. Commun.* 2019, 10, 1642.

[8]. Novoselov, K. S.; Geim, A. K.; Morozov, S. V.; Jiang, D.; Katsnelson, M. I.; Grigorieva, I. V.; Dubonos, S. V.; Firsov, A. A. Two-Dimensional Gas of Massless Dirac Fermions in Graphene. *Nature* 2005, 438, 197-200.

[9]. Feng, Y.; Liu, D.; Feng, B.; Liu, X.; Zhao, L.; Xie, Z.; Liu, Y.; Liang, A.; Hu, C.; Hu, Y.; He, S.; Liu, G.; Zhang, J.; Chen, C.; Xu, Z.; Chen, L.; Wu, K.; Liu, Y.-T.; Lin, H.; Huang, Z.-Q.; Hsu, C.-H.; Chuang, F.-C.; Bansil, A.; Zhou, X. J. Direct Evidence of Interaction-Induced Dirac Cones in a Monolayer Silicene/Ag(111) System. *Proc. Natl. Acad. Sci. U.S.A* 2016, 113, 14656-14661.

[10]. Liu, H.; Neal, A. T.; Zhu, Z.; Luo, Z.; Xu, X.; Tománek, D.; Ye, P. D. Phosphorene: An Unexplored 2D Semiconductor with a High Hole Mobility. *ACS Nano* 2014, 8, 4033-4041.

[11]. Cai, J.; Ruffieux, P.; Jaafar, R.; Bieri, M.; Braun, T.; Blankenburg, S.; Muoth, M.; Seitsonen, A. P.; Saleh, M.; Feng, X.; Müllen, K.; Fasel, R. Atomically Precise Bottom-Up Fabrication of Graphene Nanoribbons. *Nature* 2010, 466, 470-473.

[12]. Chen, Y.-C.; de Oteyza, D. G.; Pedramrazi, Z.; Chen, C.; Fischer, F. R.; Crommie, M. F. Tuning the Band Gap of Graphene Nanoribbons Synthesized from Molecular Precursors. *ACS Nano* 2013, 7, 6123-6128.

[13]. Basagni, A.; Sedona, F.; Pignedoli, C. A.; Cattelan, M.; Nicolas, L.; Casarin, M.; Sambi, M. Molecules—Oligomers—Nanowires—Graphene Nanoribbons: A Bottom-Up Stepwise On-Surface Covalent Synthesis Preserving Long-Range Order. *J. Am. Chem. Soc.* 2015, 137, 1802-1808.

[14]. Kimouche, A.; Ervasti, M. M.; Drost, R.; Halonen, S.; Harju, A.; Joensuu, P. M.; Sainio, J.; Liljeroth, P. Ultra-Narrow Metallic Armchair Graphene Nanoribbons. *Nat. Commun.* 2015, 6, 10177.

[15]. Zhang, H.; Lin, H.; Sun, K.; Chen, L.; Zagranyarski, Y.; Aghdassi, N.; Duhm, S.; Li, Q.; Zhong, D.; Li, Y.; Müllen, K.; Fuchs, H.; Chi, L. On-Surface Synthesis of Rylene-Type Graphene Nanoribbons. *J. Am. Chem. Soc.* 2015, 137, 4022-4025.

[16]. Talirz, L.; Söde, H.; Dumslaff, T.; Wang, S.; Sanchez-Valencia, J. R.; Liu, J.; Shinde, P.; Pignedoli, C. A.; Liang, L.; Meunier, V.; Plumb, N. C.; Shi, M.; Feng, X.; Narita, A.; Müllen, K.; Fasel, R.; Ruffieux, P. On-Surface Synthesis and Characterization of 9-Atom Wide Armchair Graphene Nanoribbons. *ACS Nano* 2017, 11, 1380-1388.

[17]. Merino-Díez, N.; Garcia-Lekue, A.; Carbonell-Sanromá, E.; Li, J.; Corso, M.; Colazzo, L.; Sedona, F.; Sánchez-Portal, D.; Pascual, J. I.; de Oteyza, D. G. Width-Dependent Band Gap in Armchair Graphene Nanoribbons Reveals Fermi Level Pinning on Au(111). *ACS Nano* 2017, 11, 11661-11668.

[18]. Han, P.; Akagi, K.; Federici Canova, F.; Mutoh, H.; Shiraki, S.; Iwaya, K.; Weiss, P. S.; Asao, N.; Hitosugi, T. Bottom-Up Graphene-Nanoribbon Fabrication Reveals Chiral Edges and Enantioselectivity. *ACS Nano* 2014, 8, 9181-9187.

[19]. Liu, J.; Li, B.-W.; Tan, Y.-Z.; Giannakopoulos, A.; Sanchez-Sanchez, C.; Beljonne, D.; Ruffieux, P.; Fasel, R.; Feng, X.; Müllen, K. Toward Cove-Edged Low Band Gap Graphene Nanoribbons. *J. Am. Chem. Soc.* 2015, 137, 6097-6103.

[20]. Ruffieux, P.; Wang, S.; Yang, B.; Sánchez-Sánchez, C.; Liu, J.; Dienel, T.; Talirz, L.; Shinde, P.; Pignedoli, C. A.; Passerone, D.; Dumslaff, T.; Feng, X.; Müllen, K.; Fasel, R. On-Surface Synthesis of Graphene Nanoribbons with Zigzag Edge Topology. *Nature* 2016, 531, 489-492.

[21]. de Oteyza, D. G.; García-Lekue, A.; Vilas-Varela, M.; Merino-Díez, N.; Carbonell-Sanromá, E.; Corso, M.; Vasseur, G.; Rogero, C.; Guitián, E.; Pascual, J. I.; Ortega, J. E.; Wakayama, Y.; Peña, D. Substrate-Independent Growth of Atomically Precise Chiral Graphene Nanoribbons. *ACS Nano* 2016, 10, 9000-9008.

[22]. Nguyen, G. D.; Tsai, H.-Z.; Omrani, A. A.; Marangoni, T.; Wu, M.; Rizzo, D. J.; Rodgers, G. F.; Cloke, R. R.; Durr, R. A.; Sakai, Y.; Liou, F.; Aikawa, A. S.; Chelikowsky, J. R.; Louie, S. G.; Fischer, F. R.; Crommie, M. F. Atomically Precise Graphene Nanoribbon Heterojunctions from a Single Molecular Precursor. *Nat. Nanotechnol.* 2017, 12, 1077-1082.

[23]. Rizzo, D. J.; Veber, G.; Cao, T.; Bronner, C.; Chen, T.; Zhao, F.; Rodriguez, H.; Louie, S. G.; Crommie, M. F.; Fischer, F. R. Topological Band Engineering of Graphene Nanoribbons. *Nature* 2018, 560, 204-208.

[24]. Gröning, O.; Wang, S.; Yao, X.; Pignedoli, C. A.; Bonin Barin, G.; Daniels, C.; Cupo, A.; Meunier, V.; Feng, X.; Narita, A.; Müllen, K.; Ruffieux, P.; Fasel, R. Engineering of Robust Topological Quantum Phases in Graphene Nanoribbons. *Nature* 2018, 560, 209-213.

[25]. Slota, M.; Keerthi, A.; Myers, W. K.; Tretyakov, E.; Baumgarten, M.; Ardavan, A.; Sadeghi, H.; Lambert, C. J.; Narita, A.; Müllen, K.; Bogani, L. Magnetic Edge States and Coherent Manipulation of Graphene Nanoribbons. *Nature* 2018, 557, 691-695.

[26]. Simonov, K. A.; Generalov, A. V.; Vinogradov, A. S.; Svirskiy, G. I.; Cafolla, A. A.; McGuinness, C.; Taketsugu, T.; Lyalin, A.; Mårtensson, N.; Preobrajenski, A. B. Synthesis of Armchair Graphene Nanoribbons from the 10,10'-Dibromo-9,9'-Bianthracene Molecules on Ag(111): The Role of Organometallic Intermediates. *Sci. Rep.* 2018, 8, 3506.

[27]. Huang, H.; Wei, D.; Sun, J.; Wong, S. L.; Feng, Y. P.; Neto, A. H. C.; Wee, A. T. S. Spatially Resolved Electronic Structures of Atomically Precise Armchair Graphene Nanoribbons. *Sci. Rep.* 2012, 2, 983.

[28]. Jariwala, D.; Marks, T. J.; Hersam, M. C. Mixed-Dimensional van der Waals Heterostructures. *Nat. Mater.* 2016, 16, 170-181.

[29]. Ci, L.; Song, L.; Jin, C.; Jariwala, D.; Wu, D.; Li, Y.; Srivastava, A.; Wang, Z. F.; Storr, K.; Balicas, L.; Liu, F.; Ajayan, P. M. Atomic Layers of Hybridized Boron Nitride and Graphene Domains. *Nat. Mater.* 2010, 9, 430-435.

[30]. Liu, L.; Park, J.; Siegel, D. A.; McCarty, K. F.; Clark, K. W.; Deng, W.; Basile, L.; Idrobo, J. C.; Li, A.-P.; Gu, G. Heteroepitaxial Growth of Two-Dimensional Hexagonal Boron Nitride Templated by Graphene Edges. *Science* 2014, 343, 163-167.

[31]. Gao, Y.; Zhang, Y.; Chen, P.; Li, Y.; Liu, M.; Gao, T.; Ma, D.; Chen, Y.; Cheng, Z.; Qiu, X.; Duan, W.; Liu, Z. Toward Single-Layer Uniform Hexagonal Boron Nitride—Graphene Patchworks with Zigzag Linking Edges. *Nano Lett.* 2013, 13, 3439-3443.

[32]. Li, M.-Y.; Shi, Y.; Cheng, C.-C.; Lu, L.-S.; Lin, Y.-C.; Tang, H.-L.; Tsai, M.-L.; Chu, C.-W.; Wei, K.-H.; He, J.-H.; Chang, W.-H.; Suenaga, K.; Li, L.-J. Epitaxial Growth of a Monolayer $WSe_2$—$MoS_2$ Lateral p-n Junction with an Atomically Sharp Interface. *Science* 2015, 349, 524-528.

[33]. Gong, Y.; Lin, J.; Wang, X.; Shi, G.; Lei, S.; Lin, Z.; Zou, X.; Ye, G.; Vajtai, R.; Yakobson, B. I.; Terrones, H.; Terrones, M.; Tay, Beng K.; Lou, J.; Pantelides, S. T.; Liu, Z.; Zhou, W.; Ajayan, P. M. Vertical and In-Plane Heterostructures from $WS_2$/$MoS_2$ Monolayers. *Nat. Mater.* 2014, 13, 1135-1142.

[34]. Liu, X.; Hersam, M. C. Borophene-Graphene Heterostructures. *Sci. Adv.* 2019, 5, eaax6444.

[35]. Ong, C. W.; Huang, H.; Zheng, B.; Kwok, R. W. M.; Hui, Y. Y.; Lau, W. M. X-Ray Photoemission Spectroscopy of Nonmetallic Materials: Electronic Structures of Boron and $B_xO_y$. *J. Appl. Phys.* 2004, 95, 3527-3534.

[36]. Park, J.; Kim, K. Y.; Chung, K.-H.; Yoon, J. K.; Kim, H.; Han, S.; Kahng, S.-J. Interchain Interactions Mediated by Br Adsorbates in Arrays of Metal—Organic Hybrid Chains on Ag(111). *J. Phys. Chem. C* 2011, 115, 14834-14838.

[37]. Pham, T. A.; Song, F.; Nguyen, M.-T.; Stöhr, M. Self-Assembly of Pyrene Derivatives on Au(111): Substituent Effects on Intermolecular Interactions. *Chem. Comm.* 2014, 50, 14089-14092.

[38]. Zint, S.; Ebeling, D.; Schlöder, T.; Ahles, S.; Mollenhauer, D.; Wegner, H. A.; Schirmeisen, A. Imaging Successive Intermediate States of the On-Surface Ullmann Reaction on Cu(111): Role of the Metal Coordination. *ACS Nano* 2017, 11, 4183-4190.

[39]. Wang, W.; Shi, X.; Wang, S.; Van Hove, M. A.; Lin, N. Single-Molecule Resolution of an Organometallic Intermediate in a Surface-Supported Ullmann Coupling Reaction. *J. Am. Chem. Soc.* 2011, 133, 13264-13267.

[40]. Liu, X.; Wei, Z.; Balla, I.; Mannix, A. J.; Guisinger, N. P.; Luijten, E.; Hersam, M. C. Self-Assembly of Electronically Abrupt Borophene/Organic Lateral Heterostructures. *Sci. Adv.* 2017, 3, e1602356.

[41]. Yang, Z.; Zhang, Y.; Zhang, J.; Zhang, K.; Che, J.; Sun, Q. The Adsorption of Ag and Sb on Ag(111) Surface. *Phys. Status Solidi B* 1999, 212, 281-285.

[42]. Chung, K.-H.; Koo, B.-G.; Kim, H.; Yoon, J. K.; Kim, J.-H.; Kwon, Y.-K.; Kahng, S.-J. Electronic Structures of One-Dimensional Metal-Molecule Hybrid Chains Studied Using Scanning Tunneling Microscopy and Density Functional Theory. *Phys. Chem. Chem. Phys.* 2012, 14, 7304-7308.

[43]. Sutter, P.; Cortes, R.; Lahiri, J.; Sutter, E. Interface Formation in Monolayer Graphene-Boron Nitride Heterostructures. *Nano Lett.* 2012, 12, 4869-4874.

[44]. Liu, X.; Balla, I.; Bergeron, H.; Campbell, G. P.; Bedzyk, M. J.; Hersam, M. C. Rotationally Commensurate Growth of $MoS_2$ on Epitaxial Graphene. *ACS Nano* 2016, 10, 1067-1075.

[45]. Li, Q.; Kolluru, V. S. C.; Rahn, M. S.; Schwenker, E.; Li, S.; Hennig, R. G.; Darancet, P.; Chan, M. K. Y.; Hersam, M. C. Synthesis of Borophane Polymorphs through Hydrogenation of Borophene. *Science* 2021, 371, 1143-1148.

[46]. Feng B.; Zhang J.; Liu R. Y.; Iimori T.; Lian C.; Li H.; Chen L.; Wu K.; Meng S.; Komori F.; Matsuda I. Direct Evidence of Metallic Bands in a Monolayer Boron Sheet. *Phys. Rev. B* 2016, 94, 041408.

[47]. Zhang Z.; Mannix A. J.; Hu Z.; Kiraly B.; Guisinger N. P.; Hersam M. C.; Yakobson B. I. Substrate-Induced Nanoscale Undulations of Borophene on Silver. *Nano Lett.* 2016, 16, 6622-6627.

[48]. M. C. Hersam et al., Electronically abrupt borophene/organic lateral heterostructures and preparation thereof, U.S. Patent Application Publication No. 2018/0222755, (2020).

[49]. Huang C.; Wu S.; Sanchez A. M.; Peters J. J. P.; Beanland R.; Ross J. S.; Rivera P.; Yao W.; Cobden D. H.; Xu X. Lateral Heterojunctions within Monolayer $MoSe_2$—$WSe_2$ Semiconductors *Nat. Mater.* 2014, 13, 1096-1101.

What is claimed is:

1. A composition, comprising:
a self-assembled mixed-dimensional heterostructure comprising 2D metallic borophene and 1D semiconducting armchair-oriented graphene nanoribbons (aGNRs) defining a borophene/aGNR lateral heterostructure in which a borophene domain is in direct contact with at least one of the aGNRs.

2. The composition of claim 1, wherein the borophene/aGNR lateral heterostructure comprises aligned, armchair-oriented graphene nanoribbons that are three carbon atoms wide (3-aGNRs) with structural heterointerfaces with borophene.

3. The composition of claim 2, wherein a width of the aGNRs is about 0.5 nm, and an average distance between two adjacent 3-aGNRs is about 1.0 nm ±0.1 nm.

4. The composition of claim 2, wherein the borophene/aGNR lateral heterostructure has apparently dimmer rows located between adjacent parallel 3-aGNRs including Br atoms.

5. The composition of claim 2, wherein an orientation of the 3-aGNRs is 30° rotated with respect to a boron row direction in borophene.

6. The composition of claim 2, wherein the borophene/aGNR lateral heterostructure has characteristics of metallic borophene on a borophene side, and a semiconducting bandgap on a 3-aGNR side.

7. The composition of claim 6, wherein a metal-semiconductor heterojunction between borophene and 3-aGNRs is electronically abrupt with no evidence of interface states.

* * * * *